United States Patent
Mihara et al.

(10) Patent No.: US 6,344,766 B1
(45) Date of Patent: *Feb. 5, 2002

(54) VOLTAGE LEVEL CONVERTER CIRCUIT IMPROVED IN OPERATION RELIABILITY

(75) Inventors: Masaaki Mihara; Yasuhiko Taito, both of Hyogo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/515,594

(22) Filed: Feb. 29, 2000

Related U.S. Application Data

(62) Division of application No. 09/045,568, filed on Mar. 23, 1998, now Pat. No. 6,049,243.

(30) Foreign Application Priority Data

Sep. 17, 1997 (JP) .............................................. 9-251860

(51) Int. Cl.⁷ .......................................... H03K 19/0185
(52) U.S. Cl. ......................................... 327/333; 327/81
(58) Field of Search ................................. 327/333, 427, 327/434, 435, 436, 437, 108; 326/80, 81

(56) References Cited

U.S. PATENT DOCUMENTS

| | | | | |
|---|---|---|---|---|
| 5,399,920 A | * | 3/1995 | Van Tran | 327/333 |
| 5,461,333 A | | 10/1995 | Condon et al. | 327/333 |
| 5,587,676 A | | 12/1996 | Chowdhury | 327/333 |
| 5,619,150 A | | 4/1997 | Briner | 327/434 |
| 5,834,948 A | | 11/1998 | Yoshizaki et al. | 326/81 |
| 5,872,476 A | | 2/1999 | Mihara et al. | 327/333 |
| 5,889,420 A | | 3/1999 | Poechmueller | 327/333 |
| 5,939,922 A | * | 8/1999 | Umeda | 327/333 |

FOREIGN PATENT DOCUMENTS

JP              5-136685          6/1993

* cited by examiner

*Primary Examiner*—Toan Tran
(74) *Attorney, Agent, or Firm*—McDermott, Will & Emery

(57) ABSTRACT

A voltage level converter circuit includes a first node, a second node having a voltage according to an input voltage, a P channel MOS transistor connected between the second node and the first node, turned on when the input voltage attains an L level, a third node to which a first voltage is supplied, a first N channel MOS transistor connected between the third node and a fourth node, turned on when the input voltage attains an H level, a second N channel MOS transistor connected between the first node and the fourth node, and having a gate to which an alleviate signal is supplied, a third N channel MOS transistor, and a level determination circuit for providing an alleviate signal according to the level of the first voltage.

8 Claims, 29 Drawing Sheets

F I G. 1 2
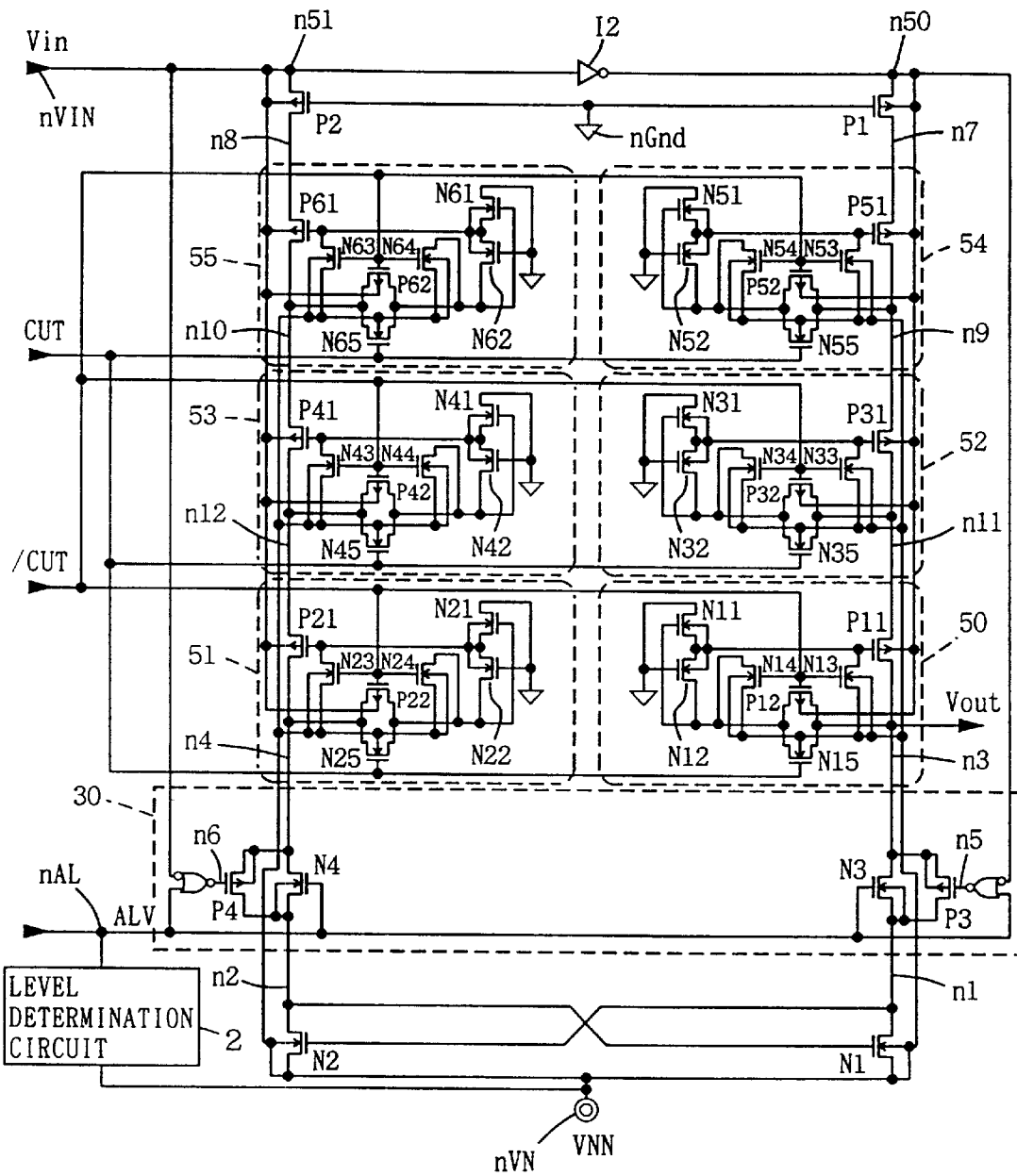

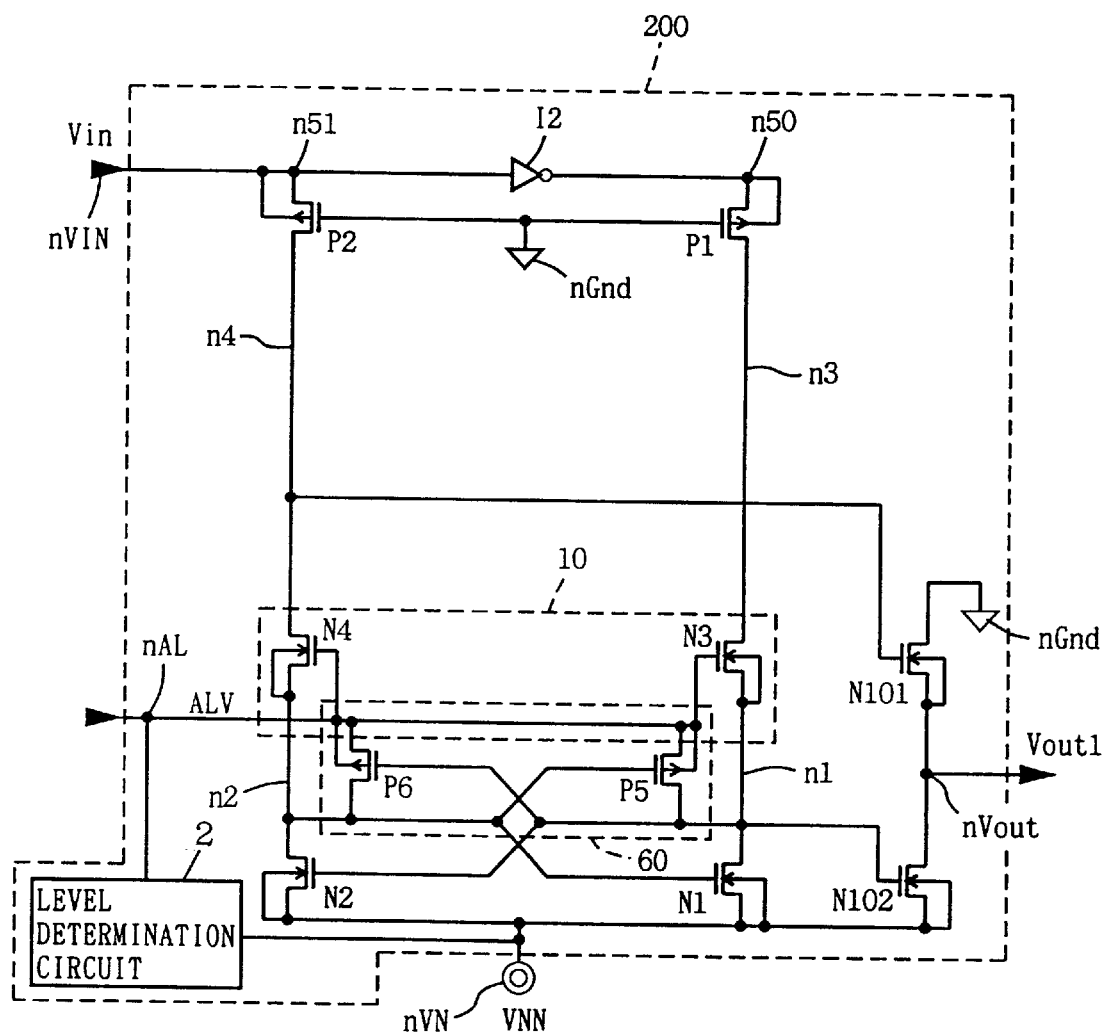
F I G. 2 5

VOLTAGE LEVEL CONVERTER CIRCUIT IMPROVED IN OPERATION RELIABILITY

CROSS REFERENCE OF RELATED APPLICATION

This application is a divisional of application Ser. No. 09/045,568 filed Mar. 23, 1998 now U.S. Pat. No. 6,049,243.

This application is related to copending application Ser. No. 08/716,846, filed Sep. 10, 1996, commonly assigned with the present application.

BACKGROUND OF THE INVENTION

1. Field of the Invention

The present invention relates to a voltage level converter circuit for converting the level of an input voltage.

2. Description of the Background Art

A flash memory must have a voltage of various levels applied to the memory cell. For example, in a DINOR type flash memory, various levels of voltages as shown in the following Table 1 must be applied corresponding to each operation mode.

TABLE 1

| Operation Mode | Bit Line | Word Line | Source Line |
|---|---|---|---|
| Program | 6 V/0 V | −11 V/0 V | Floating |
| Erase | Floating | 12 V/0 V | −11 V |
| Read | 1 V | 3.3 V/0 V | 0 V |

In Table 1, the voltage to the left of the slash (/) sign indicates the level of the voltage applied in a selected state. The voltage to the right of the slash sign indicates the level of the voltage to be applied in a nonselected state.

A voltage level converter circuit for converting the voltage level is required to supply a voltage of different levels.

FIG. 29 is a circuit diagram showing a structure of a conventional voltage level converter circuit. Referring to FIG. 29, the voltage level converter circuit includes P channel MOS transistors P1 and P2, N channel MOS transistors N1 and N2, an inverter I1, a power supply voltage node nVcc, and nodes nVIN, nVN, n1 and n2.

The operation of this voltage level converter circuit will be described hereinafter.

When voltage Vin supplied to node nVIN attains a high (H) level (logical high : 3.3V), P channel MOS transistor P1 is turned on and P channel MOS transistor P2 is turned off. This causes node n1 to be pulled up to the level of power supply voltage Vcc (here, 3.3V), whereby N channel MOS transistor N2 is turned on. In response, node n2 attains the level of voltage VNN that is supplied to node nVN (here, 11V), whereby N channel MOS transistor N1 is turned off.

When voltage Vin attains a low (L) level (logical low: 0V), P channel MOS transistor P1 is turned off and P channel MOS transistor P2 is turned on. This causes node n2 to be driven to the level of power supply voltage Vcc (here, 3.3V), whereby N channel MOS transistor N1 is turned on. In response, node n1 attains the level of voltage VNN (here, −11V) supplied to node nVN, whereby N channel MOS transistor N2 is turned off.

The above-described operation can be summarized as in the following Table 2.

TABLE 2

| VNN | Vin | P1 | P2 | N1 | N2 | n1 (Vout) | n2 |
|---|---|---|---|---|---|---|---|
| −11 V | H (3.3 V) | On | Off | Off | On | Vcc (3.3 V) | VNN (−11 V) |
| | L (0 V) | Off | On | On | Off | VNN (−11 V) | Vcc (3.3 V) |

A circuit that can set voltage Vout output from node n1 to the level of power supply voltage Vcc (3.3V) or voltage VNN (−11V) depending upon the H/L of voltage Vin supplied to node nVIN is called a voltage level converter circuit.

A circuit that converts the voltage level by switching cross-coupled N channel MOS transistors N1 and N2 as shown in FIG. 29 is called a CVSL (Cascade Voltage Switch Logic).

However, usage of this CVSL causes a high voltage across the source and drain of N channel MOS transistors N1 and N2. Hot electrons will be generated to deteriorate the switching operation. There was a problem that the reliability of the transistor is degraded.

For example, in the conventional voltage level converter circuit of FIG. 29, a voltage of 14.3V is applied across the source and drain of N channel MOS transistor N1 that is OFF when voltage Vin attains an H level.

SUMMARY OF THE INVENTION

An object of the present invention is to provide a voltage level converter circuit that insures reliability of a transistor by alleviating the voltage applied on each transistor forming the voltage level converter circuit.

According to an aspect of the present invention, a voltage level converter circuit includes an output node, a first node having a first voltage according to an input voltage, a first transistor connected between the first node and the output node, and turned on when the input voltage attains a first logic level, a second node having a second voltage, a second transistor connected between the second node and the output node, and turned on when the input voltage attains a second logic level, and a third transistor of a first conductivity type connected between the output node and the second transistor, and having a gate to which a first control signal is supplied according to the level of a second voltage.

According to another aspect of the present invention, a voltage level converter circuit includes an output node, a first node having a first voltage, a first transistor of a first conductivity type connected between the output node and the first node, and turned on when an input voltage attaining a first logic level is supplied to its gate, a second node having a second voltage, a second transistor of the first conductivity type connected between the output node and the second node, and turned on when the input voltage attains a second logic level, a third transistor of the first conductivity type connected between the gate of the second transistor and the second node, a fourth transistor of the first conductivity type connected between the gate of the third transistor and the second node, and having a gate connected to the gate of the second transistor, a fifth transistor of the first conductivity type connected between the gate of the first transistor and a drain of the fourth transistor, and having a gate supplied with a control signal according to the level of a second voltage, a sixth transistor of a second conductivity type connected between the gate of the fifth transistor and the gate of the third transistor, and having a gate connected to the gate of the second transistor, and a seventh transistor of the second conductivity type connected between the gate of the fifth transistor and the gate of the fourth transistor, and having a gate connected to the gate of the third transistor.

According to a further aspect of the present invention, a level converter circuit includes a first node having a first voltage, a first output node, a first voltage converter circuit connected between the first node and the first output node, responsive to an input first switch signal for supplying a first internal voltage according to the first voltage to the first output node, a second node having a second voltage, a second output node, a second voltage converter circuit connected between the second node and the second output node, and responsive to an input second switch signal for supplying a second internal voltage according to the second voltage to the second output node, a first transistor of a first conductivity type connected between the first node and the second output node, and having a gate connected to the first output node, and a second transistor of the first conductivity type connected between the second node and the second output node.

An advantage of the present invention is that the voltage across the source and drain of a second transistor can be alleviated to improve the reliability of the operation of the second transistor.

Another advantage of the present invention is that a first voltage can be accurately provided from an output node.

A further advantage of the present invention is that the first and second nodes can be completely disconnected.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 1–28 are circuit diagrams showing a structure of a voltage level converter circuit according to first to twenty-eighth embodiments, respectively, of the present invention.

DESCRIPTION OF THE PREFERRED EMBODIMENTS

Figure 1:
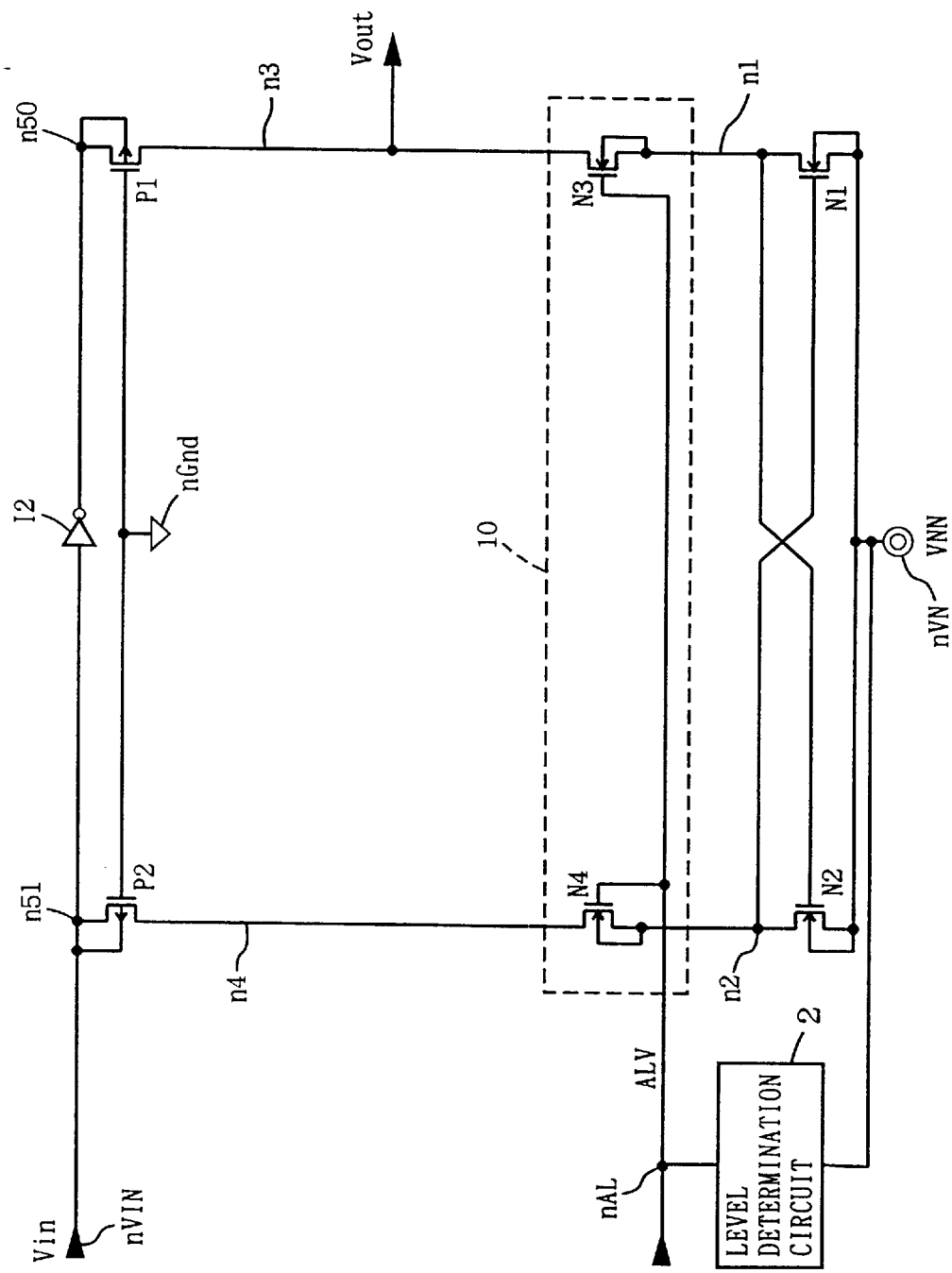
Figure 2:
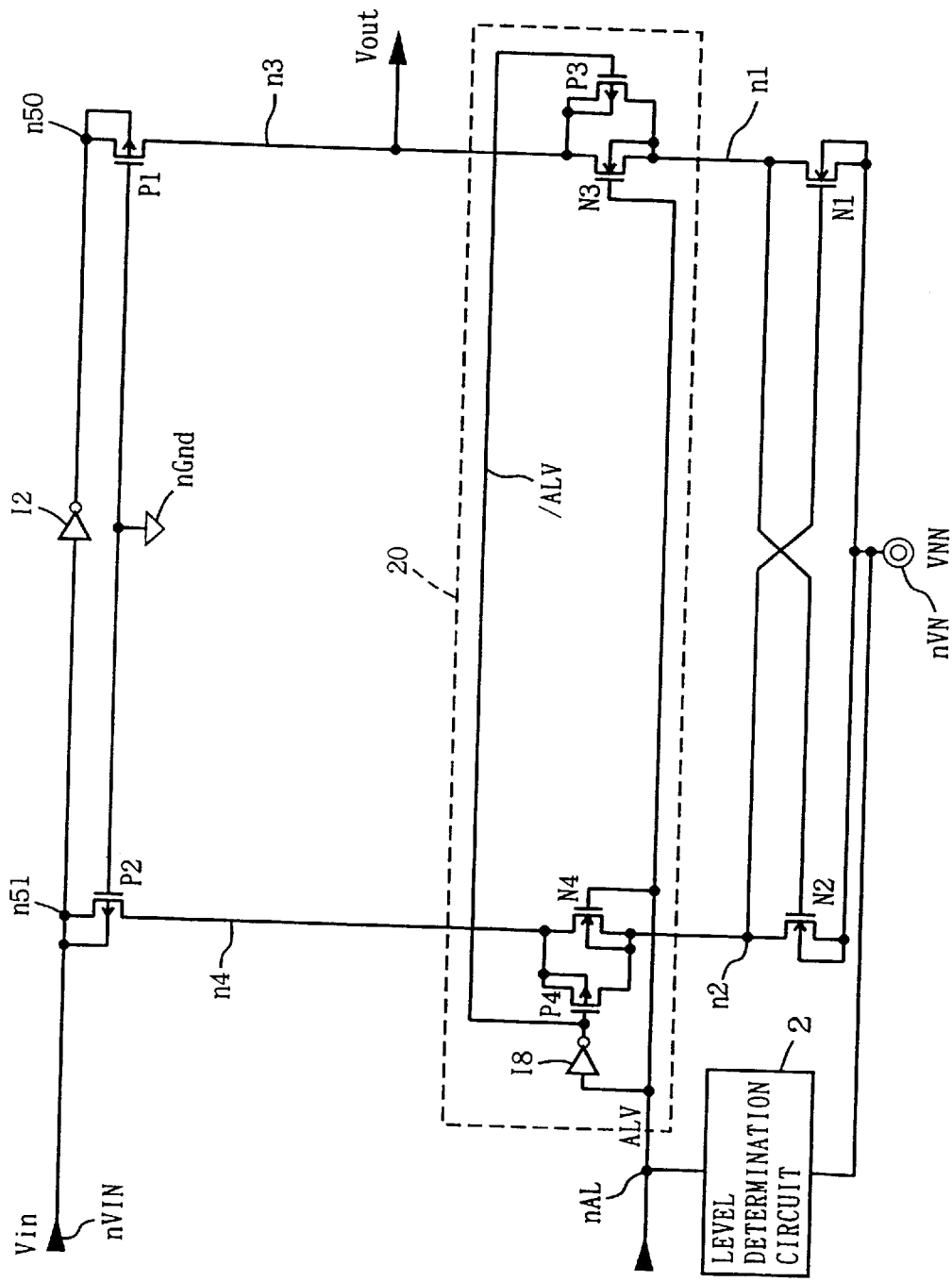

Embodiments of the present invention will be described in detail hereinafter with reference to the drawings. In the drawing, the same reference characters denote likewise or corresponding components.

First Embodiment

Referring to FIG. 1, a voltage level converter circuit according to a first embodiment of the present invention includes a node nVIN to which a voltage Vin is supplied, an inverter I2 connected to node nVIN, a node n50 connected to an output node of inverter I2, a node n3 for providing a voltage Vout, a P channel MOS transistor P1 connected between node n50 and node n3, and having a gate connected to a ground node nGnd, a node n1, a node nAL to which an alleviate signal ALV is supplied, an N channel MOS transistor N3 connected between nodes n3 and n1, and having a gate connected to node nAL, a node nVN to which a voltage VNN is supplied, an N channel MOS transistor N1 connected between nodes n1 and nVN, a level determination circuit 2 connected between nodes nVN and nAL for supplying to node nAL an alleviate signal ALV of an H level (3.3V) when voltage VNN supplied to node nVN is at least −4V and an alleviate signal ALV of an L level (0V) when voltage VNN supplied to node nVN is smaller than −4V, a node n2 connected to the gate of N channel MOS transistor N1, an N channel MOS transistor N2 connected between nodes n2 and nVN, and having a gate connected to node n1, a node n4, an N channel MOS transistor N4 connected between nodes n4 and n2, and having a gate connected to node nAL, a node n51 connected to node nVIN, and a P channel MOS transistor P2 connected between nodes n51 and n4, and having a gate connected to ground node nGND.

A voltage alleviation unit 10 is formed of N channel MOS transistor N3 and N channel MOS transistor N4.

The threshold value of all the transistors forming the voltage level converter circuit is set to 1V. The same applies to all the following embodiments.

The operation of the voltage level converter circuit of the first embodiment will be described hereinafter. The relationship between the voltage of each node according to voltage VNN applied to node nVN and voltage Vin applied to node nVIN, and the transistor state is set forth in the following Table 3.

TABLE 3

| VNN | Vin | ALV | P2 | n4 | N4 | n2 | N2 | N1 | n1 | N3 | n3 = Vout | P1 |
|---|---|---|---|---|---|---|---|---|---|---|---|---|
| −11 V | H(3.3 V) | L(0 V) | On | 3.3 V | Off | At least −1 V | Off | On | −11 V | On | −11 V | Off |
| | L(0 V) | L(0 V) | Off | −11 V | On | −11 V | On | Off | At least −1 V | Off | 3.3 V | On |
| 0 V | H(3.3 V) | H(3.3 V) | On | 3.3 V | Off | At least 2.3 V | Off | On | 0 V | On | 0 V | Off |
| | L(0 V) | H(3.3 V) | Off | 0 V | On | 0 V | On | Off | At least 2.3 V | Off | 3.3 V | On |

It is appreciated form Table 3 that, when a negative high voltage VNN (−11V) is applied to node nVN, level determination circuit 2 provides an alleviate signal ALV of an L level (0V) to node nAL.

When voltage Vin of an H level (3.3V) is applied to node nVIN, P channel MOS transistor P2 is turned on. In response, the voltage of node n4 is driven to 3.3V. Here, N channel MOS transistor N4 is OFF since 0 V is supplied to the gate thereof. Node n2 attains a high impedance state of at least −1V that is lower than the gate voltage (0V) by the threshold value (1V) of N channel MOS transistor N4. N channel MOS transistor N1 is ON since node n2 is connected to the gate thereof. The voltage of node n1 attains the level of −11V. N channel MOS transistor N2 is OFF since node n1 is connected to the gate thereof. In contrast, N channel MOS transistor N3 is ON since an alleviate signal ALV of 0V is supplied to the gate thereof. Node n3 attains the voltage level of −11V. P channel MOS transistor P1 is OFF since a voltage of 0V is applied to both the gate and source thereof.

By the above-described operation, voltage Vout of −11V is output from node n3 when a voltage of −11V is applied to node nVN and a voltage of an H level is supplied to node nVIN.

When voltage VNN of −11V is applied to node nVN and voltage Vin of an L level is supplied to node nVIN, P channel MOS transistor P2 is turned off since a voltage of 0V is supplied to the gate and source thereof. Also, voltage Vin has its logic level inverted by inverter I2. Therefore, a voltage of an H level (3.3V) is supplied to the source of P channel MOS transistor P1. Here, P channel MOS transistor P1 is turned on since a voltage of 0V is applied to the gate thereof. As a result, node n3 attains the voltage level of 3.3V.

Thus, voltage Vout of the level of voltage VNN (−11V)/ power supply voltage Vcc (3.3V) is output from node n3 according to the H/L state of voltage Vin.

When voltage VNN of 0V is applied to node nVN, level determination circuit 2 provides an alleviate signal ALV of an H level (3.3V) to node nAL.

Here, P channel MOS transistor P2 is turned on when voltage Vin of an H level (3.3V) is supplied to node nVIN. As a result, node n4 attains the voltage level of 3.3V. Here, N channel MOS transistor N4 is OFF since a voltage of 3.3V is supplied to the gate thereof. Node n2 attains a high impedance state of at least 2.3V that is lower than the gate voltage (3.3V) by the threshold value (1V) of N channel MOS transistor N4. N channel MOS transistor N1 is ON since node n2 is connected to the gate thereof. As a result, node n1 attains the voltage level of 0V. N channel MOS transistor N2 is turned off since node n1 is connected to the gate thereof. N channel MOS transistor N3 is turned on since an alleviate signal ALV of 3.3V is supplied to the gate thereof. As a result, node n3 attains a voltage level of 0V. P channel MOS transistor P1 is turned off since a voltage of 0V is supplied to the gate and source thereof.

By the above-described operation, voltage Vout of 0V is provided from node n3 when a voltage of 0V is applied to node nVN and a voltage of an H level is applied to node nVIN.

According to a similar operation, the power supply voltage Vcc of 3.3V is provided from node n3 as voltage Vout when voltage VNN of 0V is applied to node nVN and voltage Vin of an L level is supplied to node nVIN.

According to the voltage level converter circuit of the present embodiment, the voltage across the source and drain of N channel MOS transistors N1 and N2 can be reduced by altering the voltage level (logic level) of alleviate signal ALV according to the level of voltage VNN.

Figure 29:
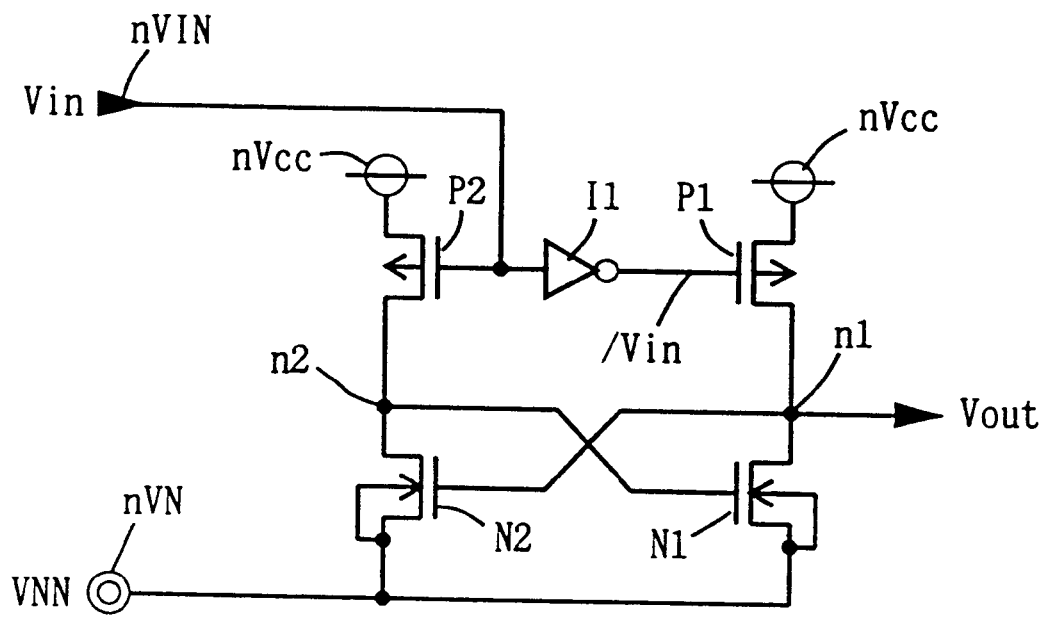
FIG. 29 is a circuit diagram showing a structure of a conventional voltage level converter circuit.

For example, when voltage VNN is −11V and voltage Vin is 3.3V, a voltage of (at least) 10V corresponding to the potential difference between nodes n2 and nVN is applied across the source and drain of N channel MOS transistor N2 in an OFF state. This means that a voltage alleviation of 4.3V is realized in comparison to the conventional voltage level converter circuit of FIG. 29 in which a voltage of 14.3V is applied across the source and drain of N channel MOS transistor N1 of an OFF state.

In the present embodiment, alleviate signal ALV is generated by level determination circuit 2. However, alleviate signal ALV can be supplied from another internal circuit or from an external source according to the level of voltage VNN applied to node nVN.

Second Embodiment

In the above-described voltage level converter circuit of the first embodiment, the voltage of node n1 or n2 can rise only to the voltage level of (Vcc−Vth), i.e., 2.3V, assuming that the threshold value of N channel MOS transistors N3 and N4 is voltage Vth (1V) when voltage VNN is 0V. There is a possibility that the upper limit of the voltage level that node n1 or n2 can reach is further lowered when power supply voltage Vcc is reduced or when voltage Vth becomes higher due to process variation and the like. In such a case, N channel MOS transistor N1 and N channel MOS transistor N2 may not be turned on sufficiently.

To compensate for this problem, the voltage level converter circuit of the second embodiment shown in FIG. includes, in addition to the components of the voltage level converter circuit of the first embodiment, a P channel MOS transistor P3 connected between nodes n3 and n1, in parallel to N channel MOS transistor N3, and having a gate supplied with an inverted signal /ALV of an alleviate signal ALV, a P channel MOS transistor P4 connected between nodes n4 and n2, in parallel to N channel MOS transistor N4, and having a gate supplied with an inverted signal /ALV of alleviate signal ALV, and an inverter I8 for inverting alleviate signal ALV. The voltage level converter circuit of the second embodiment prevents reduction in the voltages of nodes n1 and n2 caused by the threshold value of N channel MOS transistors N3 and N4. Here, a voltage alleviate unit 20 is formed of inverter I8, N channel MOS transistors N3, N4, and P channel MOS transistors P3, P4.

The relationship between the voltage of each node according to voltage VNN applied to node nVN and voltage Vin applied to node nVIN and the state of respective transistors is set forth in the following.

TABLE 4

| VNN | Vin | ALV | /ALV | P2 | n4 | N4 | P4 | n2 | N2 | N1 | n1 | P3 | N3 | n3 = Vout | P1 |
|---|---|---|---|---|---|---|---|---|---|---|---|---|---|---|---|
| −11 V | H(3.3 V) | L(0 V) | 3.3 V | On | 3.3 V | Off | Off | At least −1 V | Off | On | −11 V | Off | On | −11 V | Off |
|  | L(0 V) | L(0 V) | 3.3 V | Off | −11 V | On | Off | −11 V | On | Off | At least −1 V | Off | Off | 3.3 V | On |
| 0 V | H(3.3 V) | H(3.3 V) | 0 V | On | 3.3 V | Off | On | 3.3 V | Off | On | 0 V | Off | On | 0 V | Off |
|  | L(0 V) | H(3.3 V) | 0 V | Off | 0 V | On | Off | 0 V | On | Off | 3.3 V | On | Off | 3.3 V | On |

It is appreciated from Table 4 that the voltage level converter circuit of the second embodiment operates in a manner similar to that of the voltage level converter circuit of the first embodiment, provided that, when voltage VNN of 0V is applied to node nVN, inverted signal /ALV of alleviate signal ALV attains the level of 0V since alleviate signal ALV attains the level of power supply voltage Vcc (3.3V), whereby P channel MOS transistors P4 and P3 are turned on when voltage Vin is 3.3V (H) and 0V (L), respectively.

Thus, the voltage of node n4 (3.3V) is applied to node n2 when voltage Vin is 3.3V, and the voltage of node n3 (3.3V) is applied to node n1 when voltage Vin is 0V.

According to the voltage level converter circuit of the second embodiment, reduction in the voltage of nodes n1 and n2 by the threshold values of N channel MOS transistors N3 and N4 can be avoided. N channel MOS transistors N1 and N2 can be reliably turned on to improve the stabilization of the operation.

Third Embodiment

In the above-described voltage level converter circuit of the second embodiment, P channel MOS transistor P3 has a gate of power supply voltage Vcc (3.3V) level, and the source and drain both at the −11V level when alleviate signal ALV is 0V with voltage Vin of 3.3V.

Therefore, a voltage of 14.3V is applied to the gate oxide film of P channel MOS transistor P3.

This application of a high voltage to the gate oxide film will induce deterioration in the switching operation of the transistor to degrade the reliability thereof.

Figure 3:
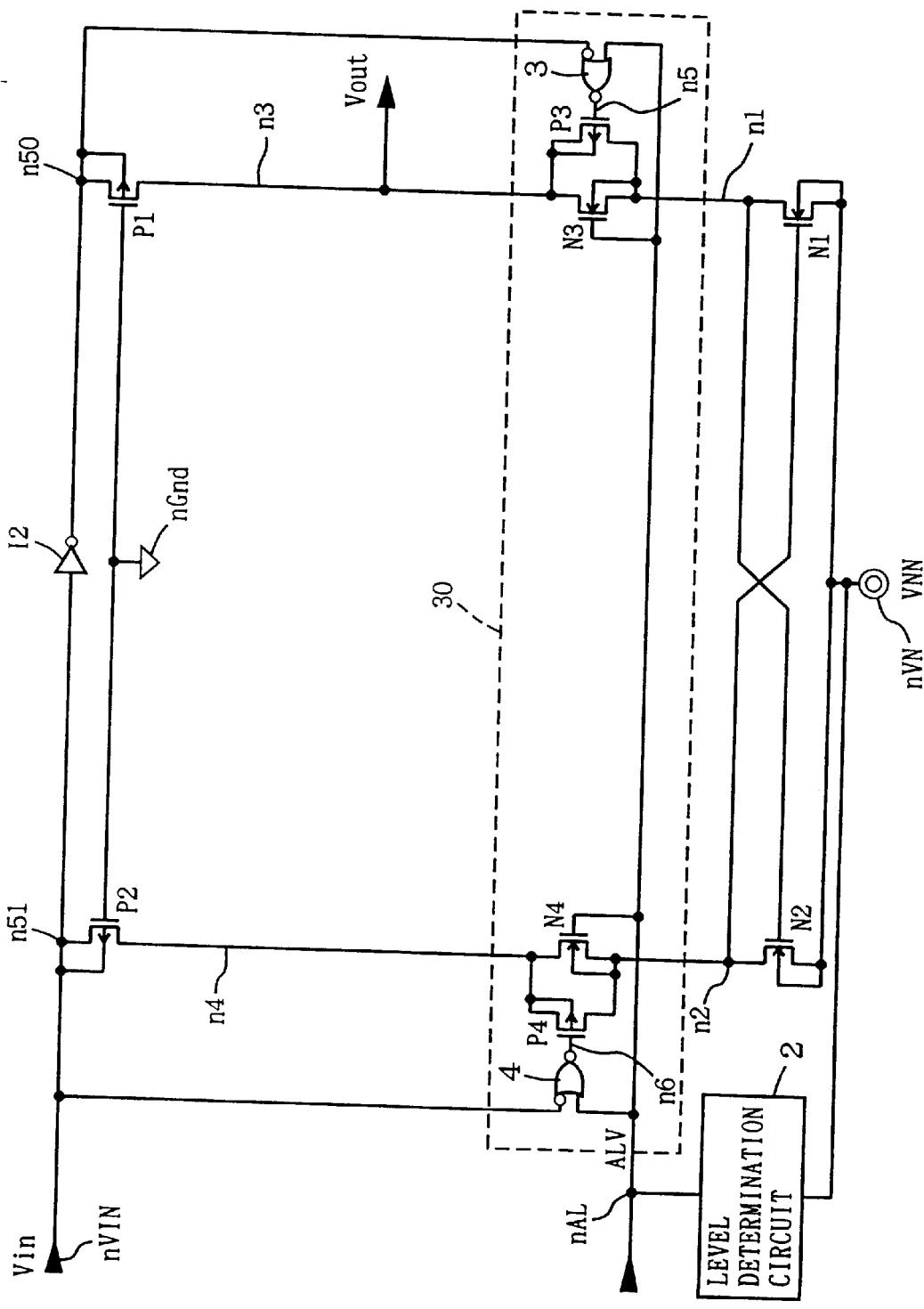

In view of the foregoing, the voltage level converter circuit of the third embodiment of the present invention has the gate voltage of P channel MOS transistors P3 and P4 controlled according to alleviate signal ALV and voltage Vin as shown in FIG. 3.

More specifically, the voltage level converter circuit of the third embodiment has a structure similar to that of the voltage level converter circuit of the second embodiment, provided that inverter I8 is absent, and a logic gate 4 receiving two voltages (signals) of voltage Vin and alleviate signal ALV, and having an output node n6 connected to the gate of P channel MOS transistor P4, and a logic gate 3 receiving an inverted signal of voltage Vin and alleviate signal ALV, and having an output node n5 connected to the gate of P channel MOS transistor P3 are further included. Here, N channel MOS transistors N3 and N4, P channel MOS transistors P3 and P4, and logic gates 3 and 4 form voltage alleviate unit 30.

The relationship between the voltage of each node -corresponding to voltage VNN applied to node nVN and voltage Vin applied to node nVIN, and the state of respective transistors is set forth in the following.

TABLE 5

| VNN | Vin | ALV | P2 | n4 | N4 | n6 | P4 | n2 | N2 | N1 | n1 | P3 | n5 | N3 | n3 = Vout | P1 |
|---|---|---|---|---|---|---|---|---|---|---|---|---|---|---|---|---|
| −11 V | H(3.3 V) | L(0 V) | On | 3.3 V | Off | 3.3 V | Off | At least −1 V | Off | On | −11 V | Off | 0 V | On | −11 V | Off |
|  | L(0 V) | L(0 V) | Off | −11 V | On | 0 V | Off | −11 V | On | Off | At least −1 V | Off | 3.3 V | Off | 3.3 V | On |
| 0 V | H(3.3 V) | H(3.3 V) | On | 3.3 V | Off | 0 V | On | 3.3 V | Off | On | 0 V | Off | 0 V | On | 0 V | Off |
|  | L(0 V) | H(3.3 V) | Off | 0 V | On | 0 V | Off | 0 V | On | Off | 3.3 V | On | 0 V | Off | 3.3 V | On |

It is appreciated from Table 5 that the voltage of nodes n1 and n3 attain the level of −11V when the voltage supplied to node nVIN is 3.3V (H) in the case where voltage VNN of −11V is applied to node nVN. Here, the voltage of node n5 attains the level of 0V, so that the voltage applied on the gate oxide film of P channel MOS transistor P3 is alleviated to the level of 11V.

Similarly, in the event that when voltage VNN of −11V is applied to node nVN, the voltage of nodes n2 and n4 attains the level of −11V when the voltage applied to node nVIN is 0V (L). Here, the voltage of node n6 attains the level of 0V, so that the voltage applied on the gate oxide film of P channel MOS transistor P4 is alleviated to the level of 11V.

According to the voltage level converter circuit of the third embodiment, the voltage on the gate oxide films of P channel MOS transistors P3 and P4 can be alleviated. Therefore, the reliability of the operations of P channel MOS transistors P3 and P4 can be further improved.

Fourth Embodiment

In the previous voltage level converter circuit of the first embodiment shown in FIG. 1, a maximum voltage of 11V is applied across the source and drain of P channel MOS transistors P1 and P2. The voltage level converter circuit of the present fourth embodiment further includes alleviate circuits 40 and 41 as shown in FIG. 4 to alleviate the voltage across the source and drain of P channel MOS transistors P1 and P2.

Figure 4:
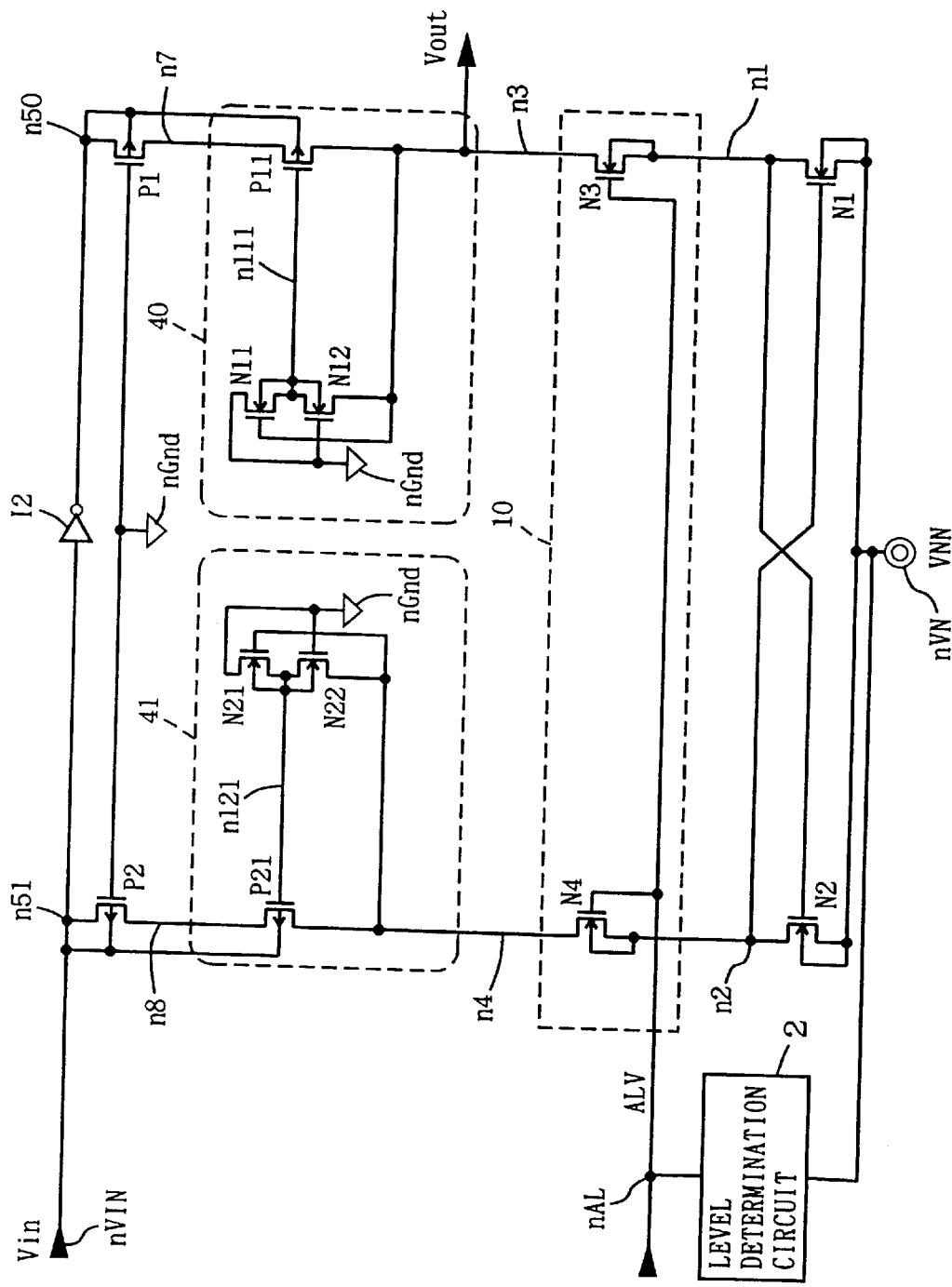

Referring to FIG. 4, alleviate circuit 40 includes a P channel MOS transistor P11 connected between P channel MOS transistor P1 and node n3, a ground node nGnd, an N channel MOS transistor N11 connected between ground node nGnd and the gate of P channel MOS transistor P11, and having a gate connected to node n3, and an N channel MOS transistor N12 connected between the gate of P channel MOS transistor P11 and node n3, and having a gate connected to ground node nGnd.

Alleviate circuit 41 has a structure similar to that of alleviate circuit 40, and includes a P channel MOS transistor P21, N channel MOS transistors N21 and N22, and ground node nGnd.

The operation of alleviate circuit 40 will be described hereinafter.

According to the circuitry formed of N channel MOS transistor N11 and N channel MOS transistor N12, ground voltage (0V) is compared with the voltage of node n3, and the lower thereof is supplied to node n111. In the following, this circuitry is called "lower voltage preferential circuit".

When the voltage of node n3 is higher than ground voltage (0V), the ground voltage is supplied to the gate of N channel MOS transistor N12, and the voltage of node n3 is applied to the drain. Therefore, N channel MOS transistor N12 is turned off.

Here, N channel MOS transistor N11 has its gate supplied with the voltage of node n3 and its source supplied with the ground voltage. Therefore, N channel MOS transistor N11 is turned on, whereby the ground voltage is propagated to node n111.

When the voltage of node n3 is lower than ground voltage, N channel MOS transistor N12 has its gate supplied with the ground voltage and its source supplied with the voltage of node n3. Therefore, N channel MOS transistor N12 is turned on, whereby the voltage of node n3 is supplied to node n111.

Here, N channel MOS transistor N11 has its gate supplied with the voltage of node n3, and its drain supplied with the ground voltage. Therefore, N channel MOS transistor N11 is turned off.

Thus, the lower of the ground voltage and the voltage of node n3 is supplied to node n111.

Here, P channel MOS transistor P11 has its gate connected to node n111, and its drain connected to node n3. Therefore, when the voltage of node n3 is lower than the ground voltage, the voltage of node n111 becomes equal to the voltage of node n3. Accordingly, P channel MOS transistor P11 attains a state in which its gate and drain are electrically connected. More specifically, P channel MOS transistor P11 attains a diode-connected state.

Therefore, the case where the voltage of node n3 is lower than the ground voltage is called the "diode mode".

When the voltage of node n3 is higher than the ground voltage, node n111 attains the level of the ground voltage. Here, P channel MOS transistor P11 is turned on when the voltage of node n3 is higher than the ground voltage by the threshold value (1V) of P channel MOS transistor P11. As a result, nodes n7 and n3 are electrically connected. Here, P channel MOS transistor P11 functions as a transfer gate. Therefore, the case where the voltage of node n3 is higher than the ground voltage is referred to as the "TG mode".

An alleviate circuit 40 with the property of attaining a diode mode or a TG mode according to the level of the voltages of the two nodes is called a "switching diode".

The relationship between the voltage of each node according to the (H/L) level of voltages VNN and Vin applied to node nVN and the state of the transistor is set forth in the following.

TABLE 6

| VNN | Vin | ALV | n8 | P21 | n4 | N4 | n2 | N2 | N1 | n1 | N3 | n3 = Vout | P11 | n7 | P1 |
|---|---|---|---|---|---|---|---|---|---|---|---|---|---|---|---|
| −11 V | H(3.3 V) | L(0 V) | 3.3 V | On | 3.3 V | Off | −1 V | Off | On | −11 V | On | −11 V | Off | −10 V | Off |
|  | L(0 V) | L(0 V) | −10 V | Off | −11 V | On | −11 V | On | Off | −1 V | Off | 3.3 V | On | 3.3 V | On |
| 0 V | H(3.3 V) | H(3.3 V) | 3.3 V | On | 3.3 V | Off | At least 2.3 V | Off | On | 0 V | On | 0 V | Off | Not more than 1 V | Off |
|  | L(0 V) | H(3.3 V) | Not more than 1 V | Off | 0 V | On | 0 V | On | Off | At least 2.3 V | Off | 3.3 V | On | 3.3 V | On |

It is appreciated from Table 6 that the voltage level converter circuit of the present fourth embodiment operates in a manner similar to that of the voltage level converter circuit of FIG. 1, provided that node n3 attains a voltage level of −11V that is lower than the ground voltage when voltage VNN applied to node nVN is −11V and voltage Vin is 3.3V. In such a case, alleviate circuit 40 attains a diode mode, whereby node n7 attains a voltage level of −10V that is higher than the voltage level of node n3 by the threshold value of P channel MOS transistor P11. Alleviate circuit 41 attains a TG mode, and nodes n4 and n8 both attain the level of power supply voltage Vcc (3.3V).

According to the voltage level converter circuit of the fourth embodiment, the voltage across the source and drain of P channel MOS transistors P1 and P2 can be alleviated.

Fifth Embodiment

Figure 5:
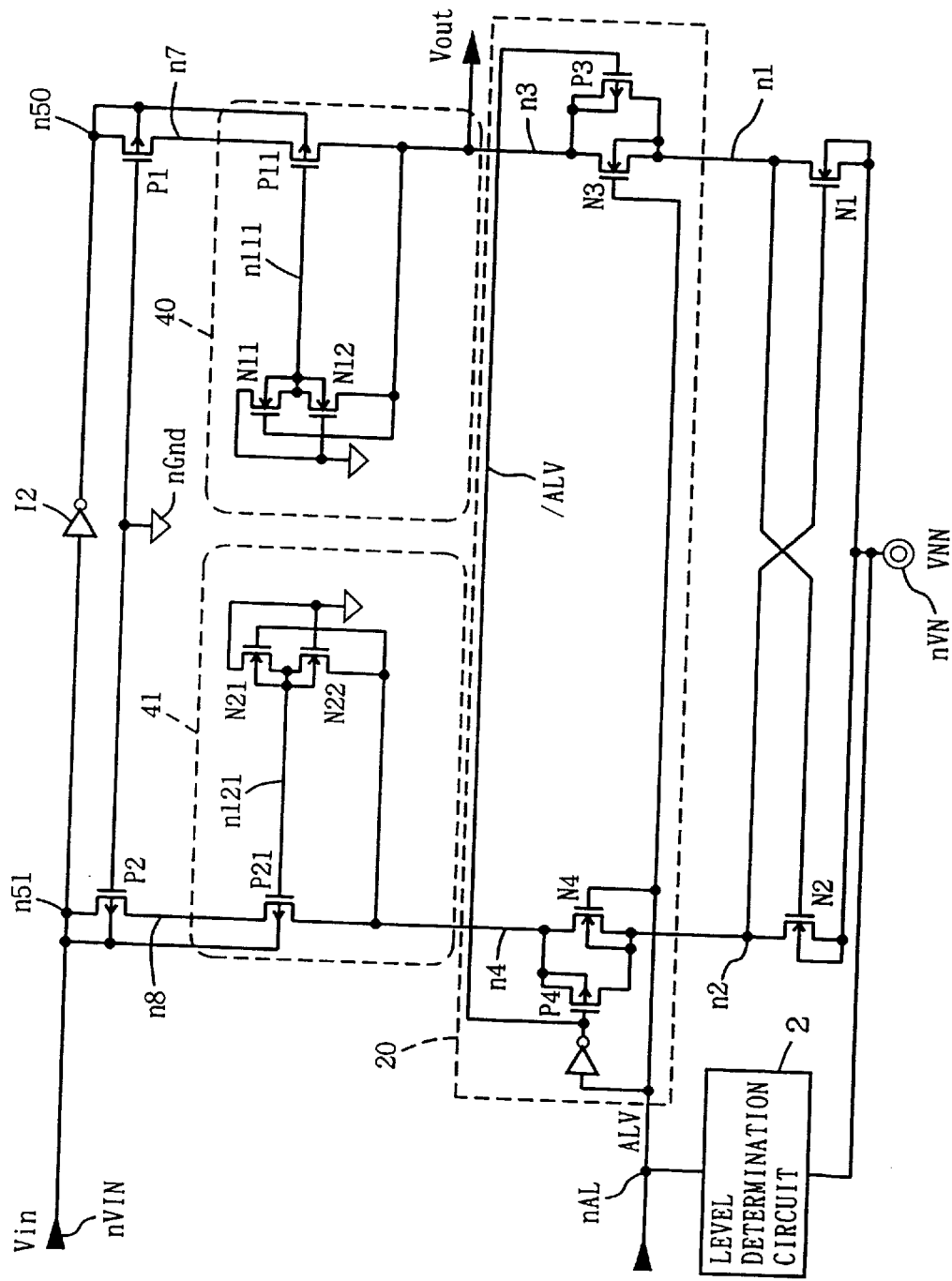

FIG. 5 shows a structure of a voltage level converter circuit according to a fifth embodiment of the present invention.

It is appreciated from FIG. 5 that the voltage level converter circuit of the fifth embodiment has a structure similar to that of the voltage level converter circuit of the fourth embodiment shown in FIG. 4, provided that a voltage alleviate unit 20 is substituted for voltage alleviate unit 10.

The voltage of each node corresponding to voltage VNN applied to node nVN and voltage Vin applied to node nVIN is set forth in the following.

It is appreciated from Table 7 that the voltage level converter circuit of the fifth embodiment has an advantage of improving the reliability of the switching operation of N channel MOS transistors N1 and N2 since the voltage of nodes n2 and n1 attain the level of 3.3V according to the H/L level of voltage Vin when voltage VNN applied to node nVN is 0V, in addition to the advantage similar to that of the voltage level converter circuit of FIG. 4.

Sixth Embodiment

Figure 6:
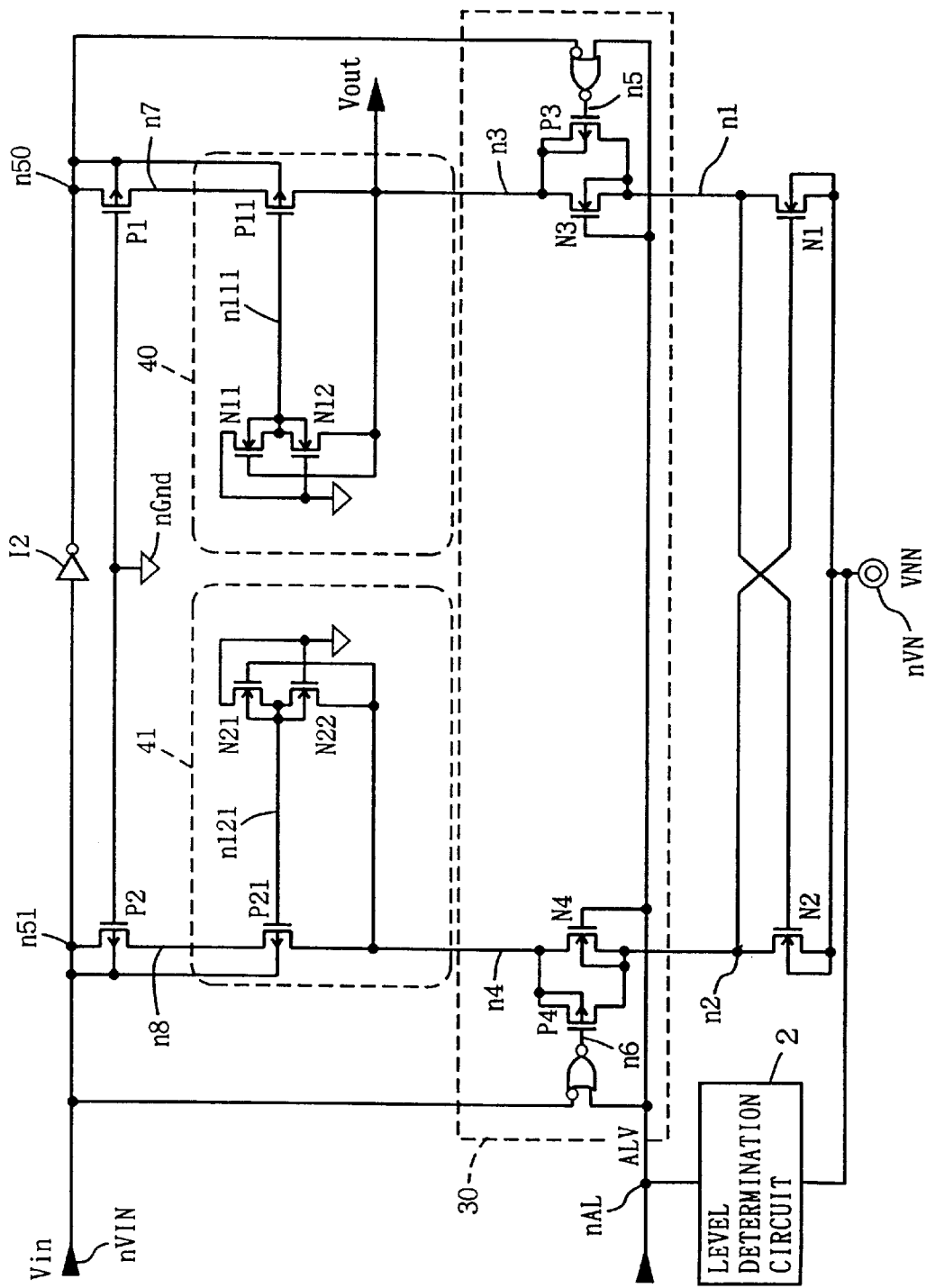

FIG. 6 is a circuit diagram showing a structure of a voltage level converter circuit according to a sixth embodiment of the present invention.

The voltage level converter circuit of the sixth embodiment has a structure similar to that of the voltage level converter circuit of the fifth embodiment shown in FIG. 5, provided that a voltage alleviate unit 30 is substituted for voltage alleviate unit 20.

TABLE 7

| VNN | Vin | ALV | n8 | n4 | n2 | n1 | n3 = Vout | n7 |
|---|---|---|---|---|---|---|---|---|
| −11 V | H(3.3 V) | L(0 V) | 3.3 V | 3.3 V | −1 V | −11 V | −11 V | −10 V |
|  | L(0 V) | L(0 V) | −10 V | −11 V | −11 V | −1 V | 3.3 V | 3.3 V |
| 0 V | H(3.3 V) | H(3.3 V) | 3.3 V | 3.3 V | 3.3 V | 0 V | 0 V | Not more than 1 V |
|  | L(0 V) | H(3.3 V) | Not more than 1 V | 0 V | 0 V | 3.3 V | 3.3 V | 3.3 V |

The voltage of each node according to voltage VNN applied to node nVN and voltage Vin applied to node nVIN is set forth in the following.

TABLE 8

| VNN | Vin | ALV | n8 | n4 | n2 | n1 | n3 = Vout | n7 | n6 | n5 |
|---|---|---|---|---|---|---|---|---|---|---|
| −11 V | H(3.3 V) | L(0 V) | 3.3 V | 3.3 V | −1 V | −11 V | −11 V | −10 V | 3.3 V | 0 V |
|  | L(0 V) | L(0 V) | −10 V | −11 V | −11 V | −1 V | 3.3 V | 3.3 V | 0 V | 3.3 V |
| 0 V | H(3.3 V) | H(3.3 V) | 3.3 V | 3.3 V | 3.3 V | 0 V | 0 V | Not more than 1 V | 0 V | 0 V |
|  | L(0 V) | H(3.3 V) | Not more than 1 V | 0 V | 0 V | 3.3 V | 3.3 V | 3.3 V | 0 V | 0 V |

The voltage level converter circuit of the sixth embodiment has an advantage similar to that of the voltage level converter circuit of the fifth embodiment. It is appreciated from FIG. 8 that, since nodes n5 and n6 attain the voltage of 0V according to the H/L level of voltage Vin supplied to node nVIN when voltage Vnn applied to node nVN is −11V, there is also an advantage of improving the switching operation reliability of P channel MOS transistors P3 and P4.

Seventh Embodiment

In the previous voltage level converter circuit of the fourth embodiment shown in FIG. 4, the voltage applied across the source and drain of P channel MOS transistors P1 and P2 can be suppressed to the maximum of 10V by virtue of alleviate circuits 40 and 41.

Figure 7:
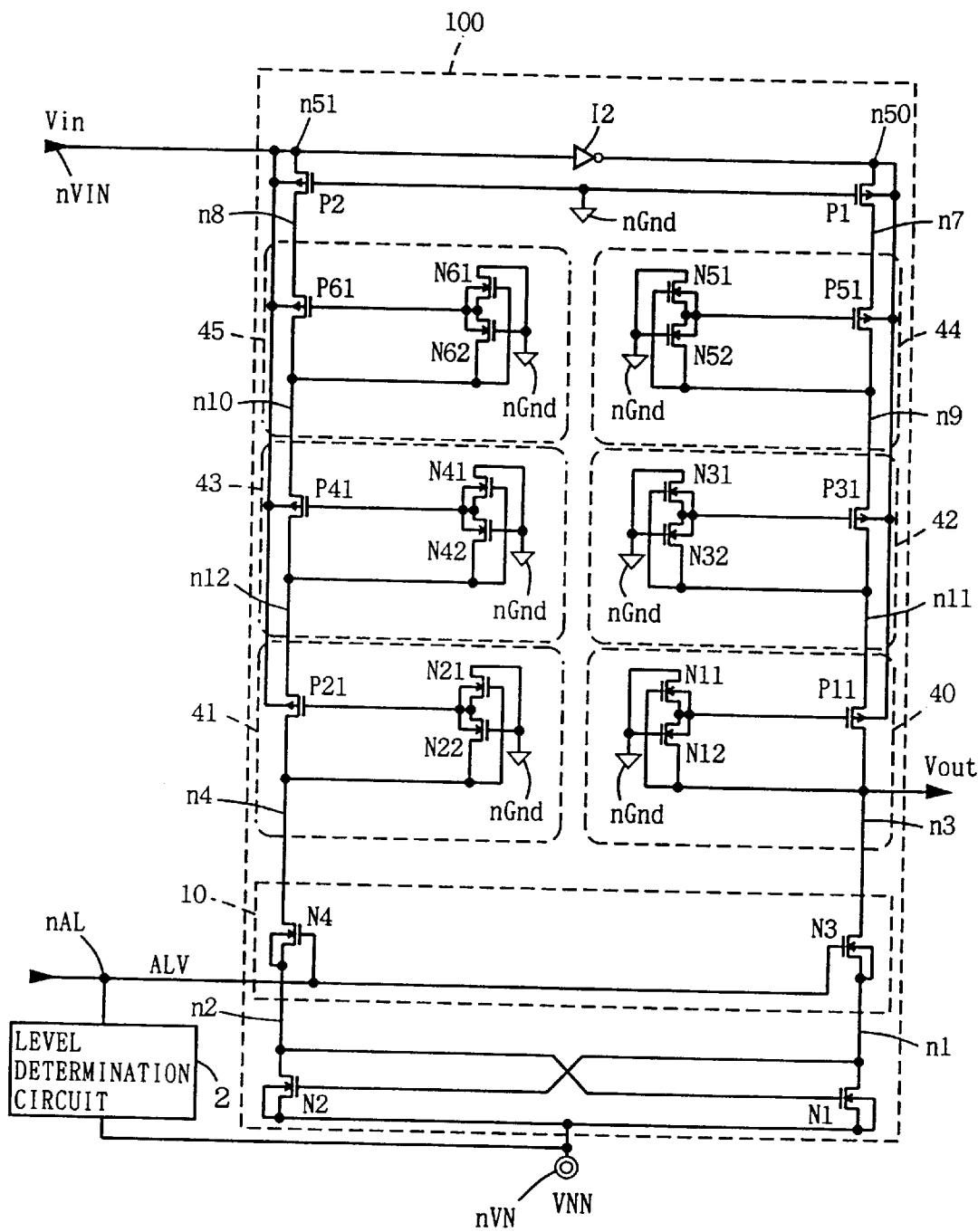

The voltage level converter circuit of the present seventh embodiment has the alleviate circuits connected in series as shown in FIG. 7 to further alleviate the voltage across the source and drain of P channel MOS transistors P1 and P2. More specifically, the voltage level converter circuit of the seventh embodiment has three alleviate circuits 40, 42 and 44 connected in series between P channel MOS transistor P1 and node n3, and three alleviate circuits 41, 43 and 45 connected in series between P channel MOS transistor P2 and node n4.

The voltage level converter circuit of the seventh embodiment provides voltage Vout from voltage converter unit 100 according to voltage VNN applied to voltage converter unit 100 and voltage Vin.

The voltage of each node according to voltage VNN supplied to node nVN and voltage Vin supplied to node nVN and voltage Vin supplied to node nVIN is set forth in the following.

high impedance state of at least 2.3V. Here, N channel MOS transistor N1 is turned on since the gate is connected to node n2. Therefore, node n1 attains the voltage level of 0V. An alleviate signal ALV of 3.3V is also applied to the gate of N channel MOS transistor N3. Therefore, N channel MOS transistor N3 is turned on, so that the voltage of node n3 attains the level of 0V.

The lower voltage preferential circuit formed of N channel MOS transistors N11 and N12 compares the voltage of node nGnd with the voltage of node n3. When the voltage difference thereof is smaller than the threshold value (1V) of N channel MOS transistors N11 and N12, both transistors are turned off. Therefore, when node n3 attains the voltage level of 0V, a voltage of at least −1V is applied to the gate of P channel MOS transistor P11. Therefore, P channel MOS transistor P11 is turned off, whereby node n11 attains a high impedance state (Hiz). Accordingly, nodes n9 and n7 both attain a high impedance state.

The number of alleviate circuits connected in series in the voltage level converter circuit of the seventh embodiment is not limited to 3 in the present invention. An arbitrary number of alleviate circuits can be connected in series.

Eighth Embodiment

Figure 8:
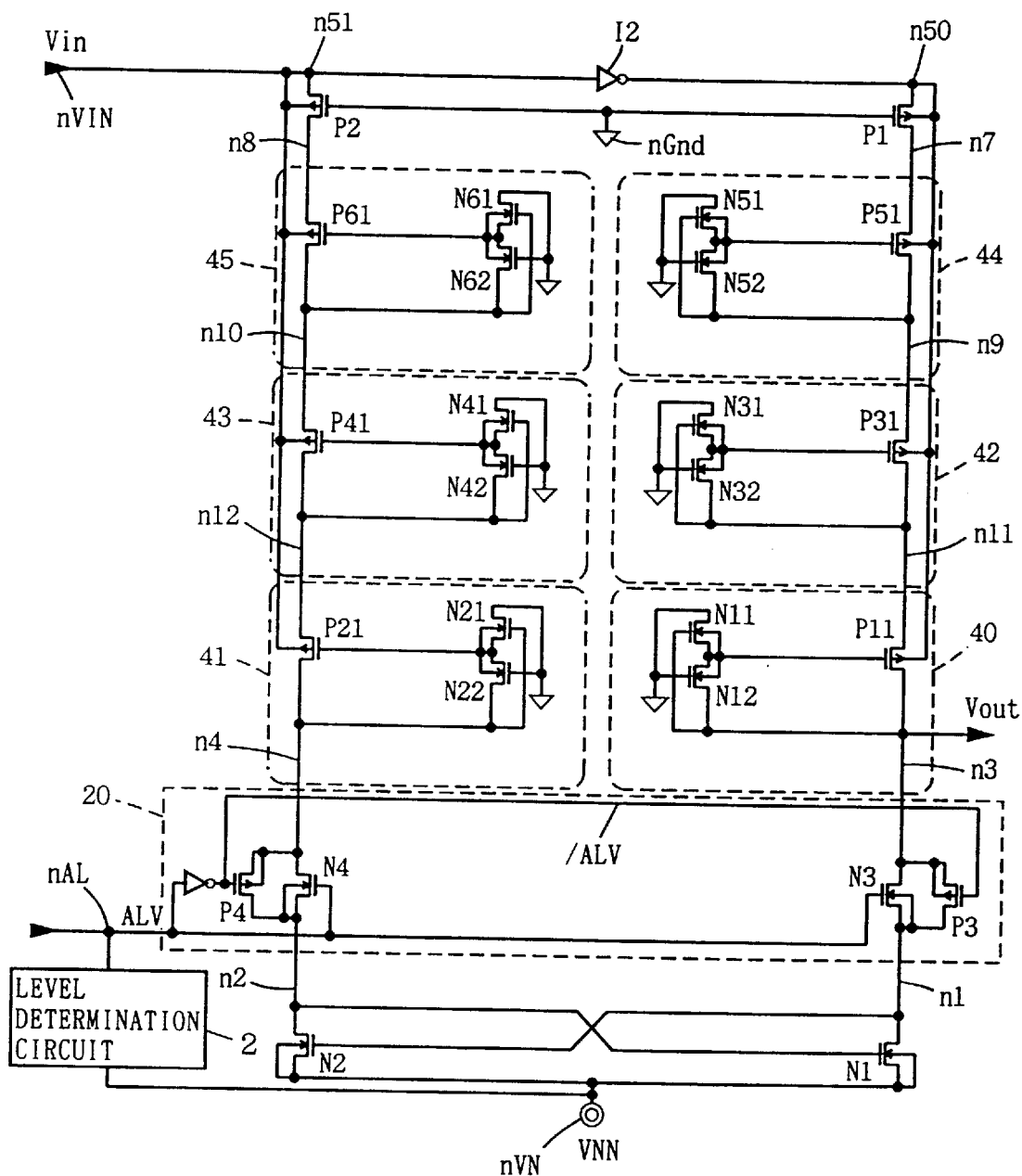

FIG. 8 is a circuit diagram showing a structure of a voltage level converter circuit according to an eighth embodiment of the present invention. The voltage level converter circuit of the present eighth embodiment has a structure similar to that of the voltage level converter circuit shown in FIG. 7, provided that a voltage alleviate unit 20 is substituted for voltage alleviate unit 10.

The voltage level converter circuit of the present eighth embodiment has an advantage similar to that of the voltage level converter circuit of the seventh embodiment, in addi-

TABLE 9

| VNN | Vin | ALV | n8 | n10 | n12 | n4 | n2 | n1 | n3 = Vout | n11 | n9 | n7 |
|---|---|---|---|---|---|---|---|---|---|---|---|---|
| −11 V | H(3.3 V) | L(0 V) | 3.3 V | 3.3 V | 3.3 V | 3.3 V | −1 V | −11 V | −11 V | −10 V | −9 V | −8 V |
|  | L(0 V) | L(0 V) | −8 V | −9 V | −10 V | −11 V | −11 V | −1 V | 3.3 V | 3.3 V | 3.3 V | 3.3 V |
| 0 V | H(3.3 V) | H(3.3 V) | 3.3 V | 3.3 V | 3.3 V | 3.3 V | At least 2.3 V | 0 V | 0 V | Hiz | Hiz | Hiz |
|  | L(0 V) | H(3.3 V) | Hiz | Hiz | Hiz | 0 V | 0 V | At least 2.3 V | 3.3 V | 3.3 V | 3.3 V | 3.3 V |

Figure 9:
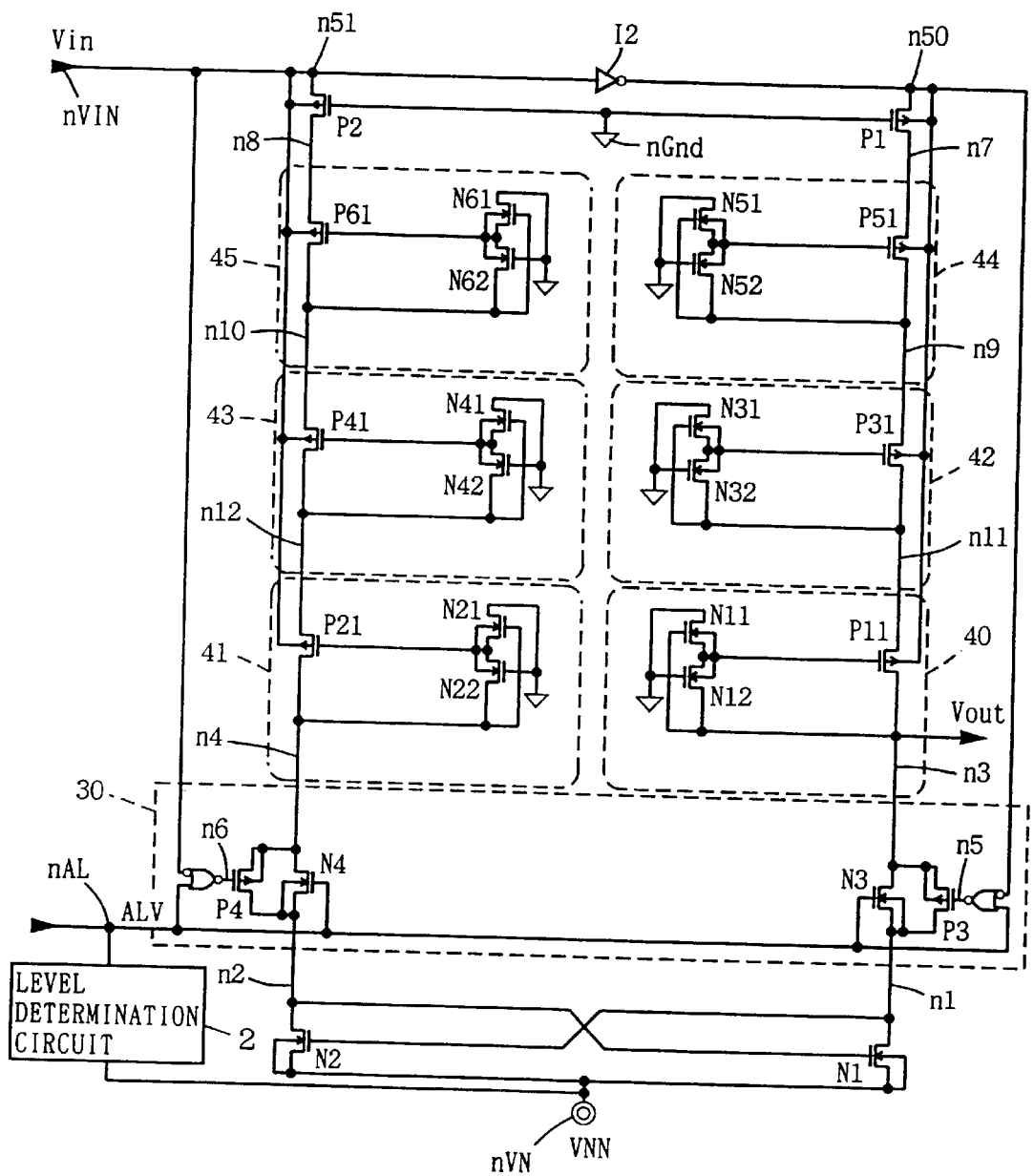

It is appreciated from FIG. 9 that alleviate circuits 40, 42 and 44 attain a diode mode when voltage VNN applied to node nVN is −11V and voltage Vin applied to node nVIN is 3.3V. Therefore, the voltage sequentially rises at the step of IV in the order of nodes n3, n11, n9 and n7. Here, alleviate circuits 41, 43 and 45 attain the TG node, so that the voltages among nodes n4, n12, n10 and n8 are equal.

The operation in the case where voltage VNN of 0V is applied to node nVN, and voltage VIN of 3.3V is applied to node nVIN will be described hereinafter.

A level determination circuit 2 provides an alleviate signal ALV of an H level (3.3V) since voltage VNN is at least −4V. Also, P channel MOS transistor P2 has its gate supplied with the ground voltage (0V), and its source supplied with 3.3V. Therefore, P channel MOS transistor P2 is turned on, so that the voltage of node n8 attains the level of 3.3V. Also, P channel MOS transistor P61 is turned on since the lower of the voltage of node n1 and the ground voltage, i.e., a voltage of not more than 0V, is supplied to the gate of P channel MOS transistor P61. Therefore, node n10 attains a voltage level of 3.3V identical to node n8. Similarly, nodes n12 and n4 both attain the level of 3.3V.

An alleviate signal ALV of 3.3V is supplied to the gate of N channel MOS transistor N4. Therefore, node n2 attains a tion to the advantage of improving the reliability of the switching operation of N channel MOS transistors N1 and N2.

Ninth Embodiment

FIG. 9 is a circuit diagram showing a structure of a voltage level converter circuit according to a ninth embodiment of the present invention. The voltage level converter circuit of the present ninth embodiment has a structure similar to that of the voltage level converter circuit shown in FIG. 8, provided that a voltage alleviate unit 30 is substituted for voltage alleviate unit 20.

The voltage level converter circuit of the ninth embodiment has an advantage similar to that of the voltage level converter circuit of the eight embodiment, in addition to the advantage of improving the reliability of the switching operation of P channel MOS transistors P3 and P4.

Tenth Embodiment

In the previous voltage level converter circuit of the seventh embodiment, nodes n7–n12 appropriately attain a high impedance state according to voltage Vin supplied to node nVIN when a voltage VNN of 0V is applied to node nVN.

However, a node attaining a high impedance state is susceptible to various noise to operate erroneously.

The voltage level converter circuit of the present tenth embodiment has alleviate circuits 40–45 disabled only when voltage VNN of 0V is applied to node nVIN.

Figure 10:
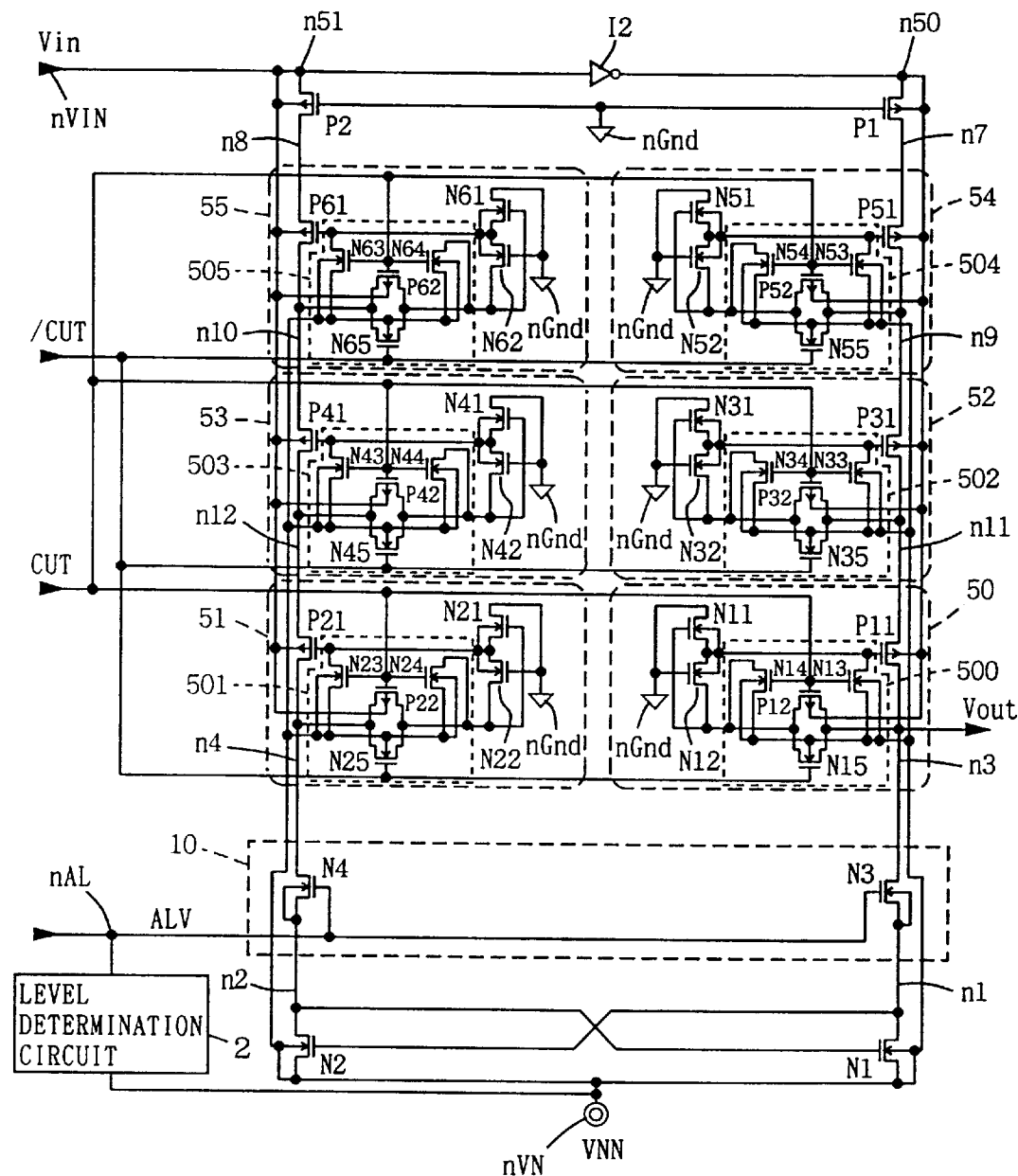

Referring to FIG. 10, a voltage level converter circuit according to the tenth embodiment of the present invention includes control circuits 500–505 in alleviate circuits 50–55, respectively. Each of control circuits 500–505 has a similar structure. For example, control circuit 500 includes an N channel MOS transistor N13 connected between the gate of P channel MOS transistor P11 and node nVN, and having a gate supplied with a control signal CUT, an N channel MOS transistor N14 connected between N channel MOS transistor N12 and node nVN, and having a gate supplied with control signal CUT, an N channel MOS transistor N15 connected between N channel MOS transistor N12 and node n3, and having a gate supplied with an inverted signal /CUT of control signal CUT, and a P channel MOS transistor P12 connected between N channel MOS transistor N12 and node n3, and having a gate supplied with control signal CUT.

The voltage of each node according to voltage VNN applied to node nVN and voltage Vin applied to node nVIN is set forth in the following.

embodiment of the present invention. The voltage level converter circuit of the eleventh embodiment has a structure similar to that of the voltage level converter circuit of the tenth embodiment, provided that voltage alleviate unit 20 is substituted for voltage alleviate unit 10.

The voltage level converter circuit of the eleventh embodiment has an advantage similar to that of the voltage level converter circuit of the tenth embodiment, in addition to the advantage that the reliability of the switching operation of N channel MOS transistors MOS transistors N1 and N2 is improved.

Twelfth Embodiment

FIG. 12 is a circuit diagram showing a structure of a voltage level converter circuit according to a twelfth embodiment of the present invention. The voltage level converter circuit of the twelfth embodiment has a structure similar to that of the voltage level converter circuit of the eleventh embodiment, provided that voltage alleviate unit 30 is substituted for voltage alleviate unit 20.

The voltage level converter circuit of the twelfth embodiment has an advantage similar to that of the voltage level converter circuit of the eleventh embodiment, in addition to the advantage of improving the reliability of switching operation of P channel MOS transistors P3 and P4.

TABLE 10

| VNN | Vin | ALV | CUT | /CUT | n8 | n10 | n12 | n4 | n2 | n1 | n3 = Vout | n11 | n9 | n7 |
|---|---|---|---|---|---|---|---|---|---|---|---|---|---|---|
| −11 V | H(3.3 V) | L(0 V) | −11 V | 3.3 V | 3.3 V | 3.3 V | 3.3 V | 3.3 V | −1 V | −11 V | −11 V | −10 V | −9 V | −8 V |
|  | L(0 V) | L(0 V) | −11 V | 3.3 V | −8 V | −9 V | −10 V | −11 V | −11 V | −1 V | 3.3 V | 3.3 V | 3.3 V | 3.3 V |
| 0 V | H(3.3 V) | H(3.3 V) | 3.3 V | 0 V | 3.3 V | 3.3 V | 3.3 V | 3.3 V | At least 2.3 V | 0 V | 0 V | 1 V | 1 V | 1 V |
|  | L(0 V) | H(3.3 V) | 3.3 V | 0 V | 1 V | 1 V | 1 V | 0 V | 0 V | At least 2.3 V | 3.3 V | 3.3 V | 3.3 V | 3.3 V |

It is appreciated from FIG. 10 that the voltage level converter circuit of the tenth embodiment operates in a manner similar to that of the voltage level converter circuit of the seventh embodiment, provided that alleviate circuit 50 is disabled when voltage VNN applied to node nVN is 0V.

When voltage VNN applied to node nVN is 0V, control signal CUT attains the level of power supply voltage Vcc, so that inverted signal /CUT of control signal CUT attains the level of 0V. In response, N channel MOS transistor N13 is turned on independent of voltage Vin supplied to node nVIN, and voltage VNN of 0V is supplied to the gate of P channel MOS transistor P11. Here, N channel MOS transistor N14 is ON, so that the transfer gate formed of P channel MOS transistor P12 and N channel MOS transistor N15 is turned off.

Therefore, when voltage Vin applied to node nVIN is 3.3V, node n11 attains a voltage level of 1V that is higher than the gate voltage (0V) of P channel MOS transistor P11 by the threshold value (1V) thereof since the voltage of node n3 attains the level of 0V as shown in Table 10. In this case, nodes n11, n9 and n7 all attain the level of 1V since alleviate circuits 52 and 54 operate in a manner similar to that of alleviate circuit 50.

Here, P channel MOS transistors P2, P61, P41 and P21 are sequentially turned on, so that nodes n8, n10, n12 and n4 all attain the level of 3.3V.

According to the voltage level converter circuit of the tenth embodiment of the present invention, the possibility of an erroneous operation can be reduced by preventing nodes n7–n12 from attaining a high impedance state.

Eleventh Embodiment

Figure 11:
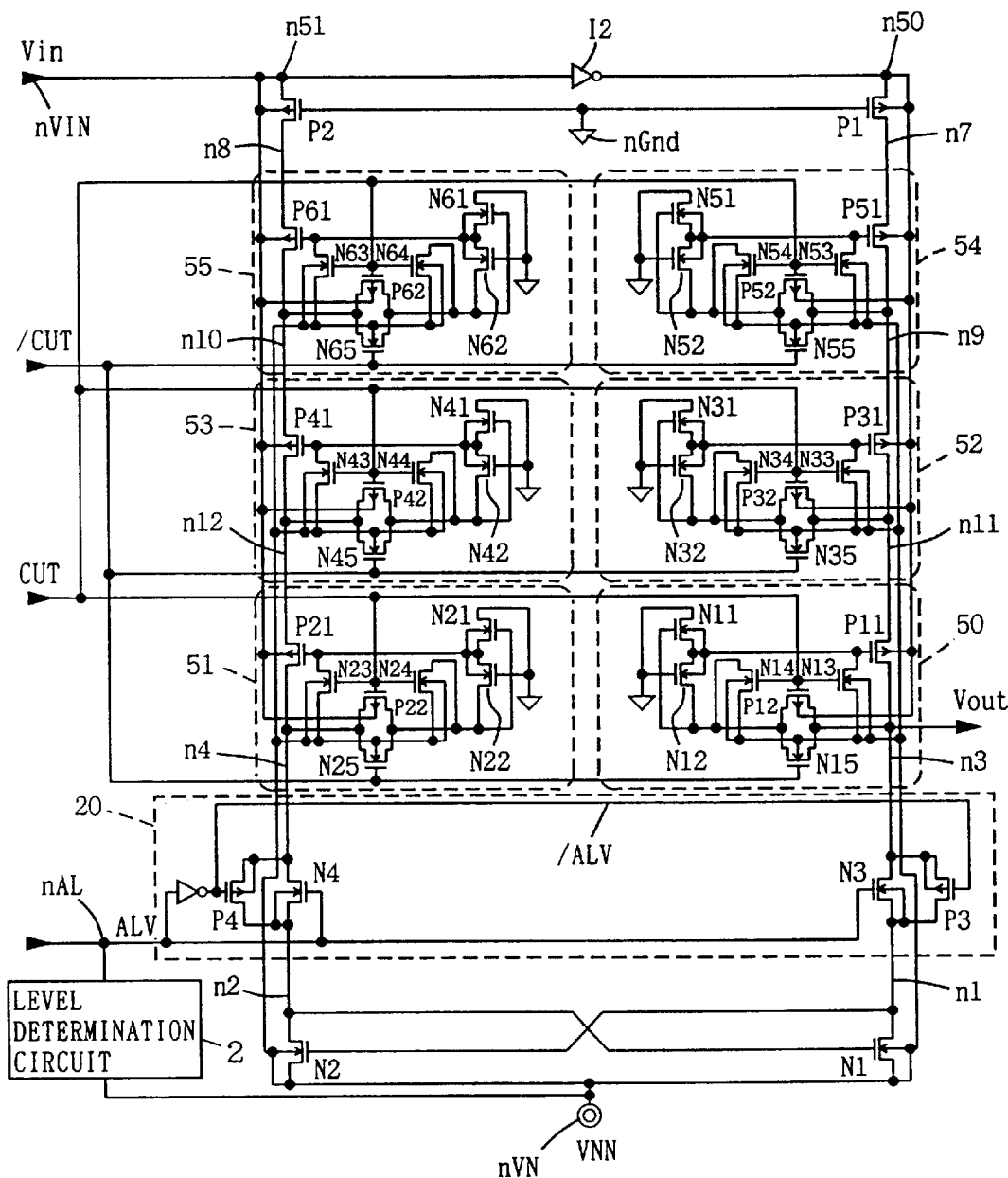
Figure 13:
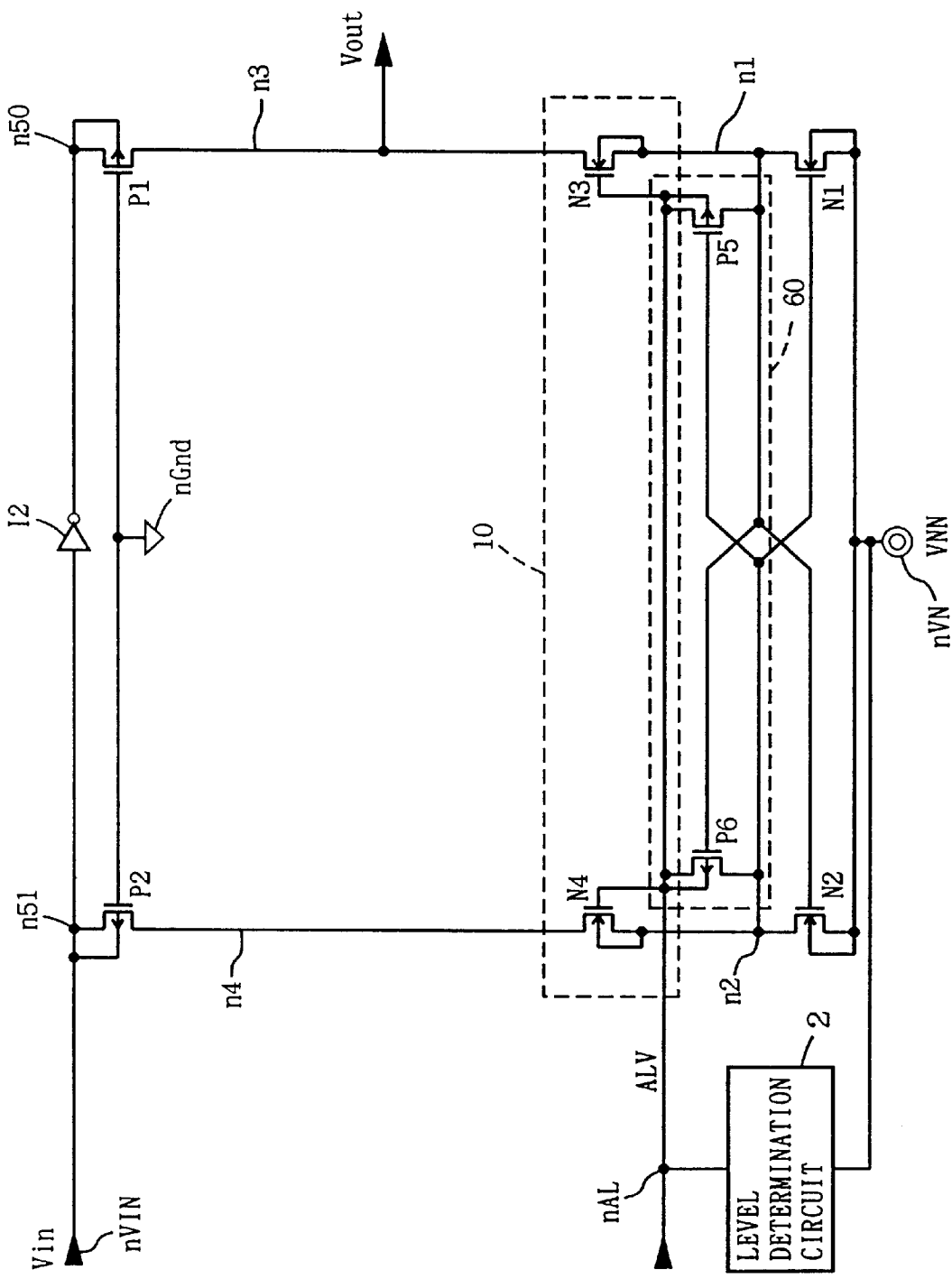

FIG. 11 is a circuit diagram showing a structure of a voltage level converter circuit according to an eleventh Thirteenth Embodiment In the previous voltage level converter circuit of the first embodiment shown in FIG. 1, N channel MOS transistors N2 and N4 are OFF and node n2 attains a high impedance state when voltage Vin attains the level of 3.3v as shown in Table 3. A node attaining such a high impedance state is susceptible to various noise to induce erroneous operation.

The voltage level converter circuit according to a thirteenth embodiment further includes, in addition to the components of the voltage level converter circuit of the first embodiment, a P channel MOS transistor P5 connected between the gate of N channel MOS transistor N3 and node n1, and having its gate connected to node n2, and a P channel MOS transistor P6 connected between nodes nAL and n2, and having a gate connected to node n1 for fixing the potential of the node that attains a high impedance state. P channel MOS transistors P5 and P6, and N channel MOS transistors N1 and N2 form a latch circuit.

The operation of the case where voltage Vin is 3.3V and voltage VNN of 0V is applied to node nVN will be described hereinafter.

First, P channel MOS transistor P2 is turned on, and the voltage of node n4 attains the level of 3.3V. Here, a voltage of 3.3V is applied to the gate of N channel MOS transistor N4, so that node n2 attains a high impedance state of at least 2.3V. N channel MOS transistor N1 has its gate connected to node n2, and its source supplied with voltage VNN of 0V. Therefore, N channel MOS transistor N1 is turned on, and the voltage of node n1 attains the level of 0V. Here, P channel MOS transistor P6 has its gate connected to node n1 and its source supplied with an alleviate signal ALV of 3.3V. Therefore P channel MOS transistor P6 is turned on, and the voltage of node n2 rises to the level of 3.3V. Thus, the event of node n2 attaining a high impedance state can be avoided.

According to the voltage level converter circuit of the thirteenth embodiment, a high impedance state of nodes n1 and n2 can be avoided to improve the operation reliability.

Fourteenth Embodiment

Figure 14:
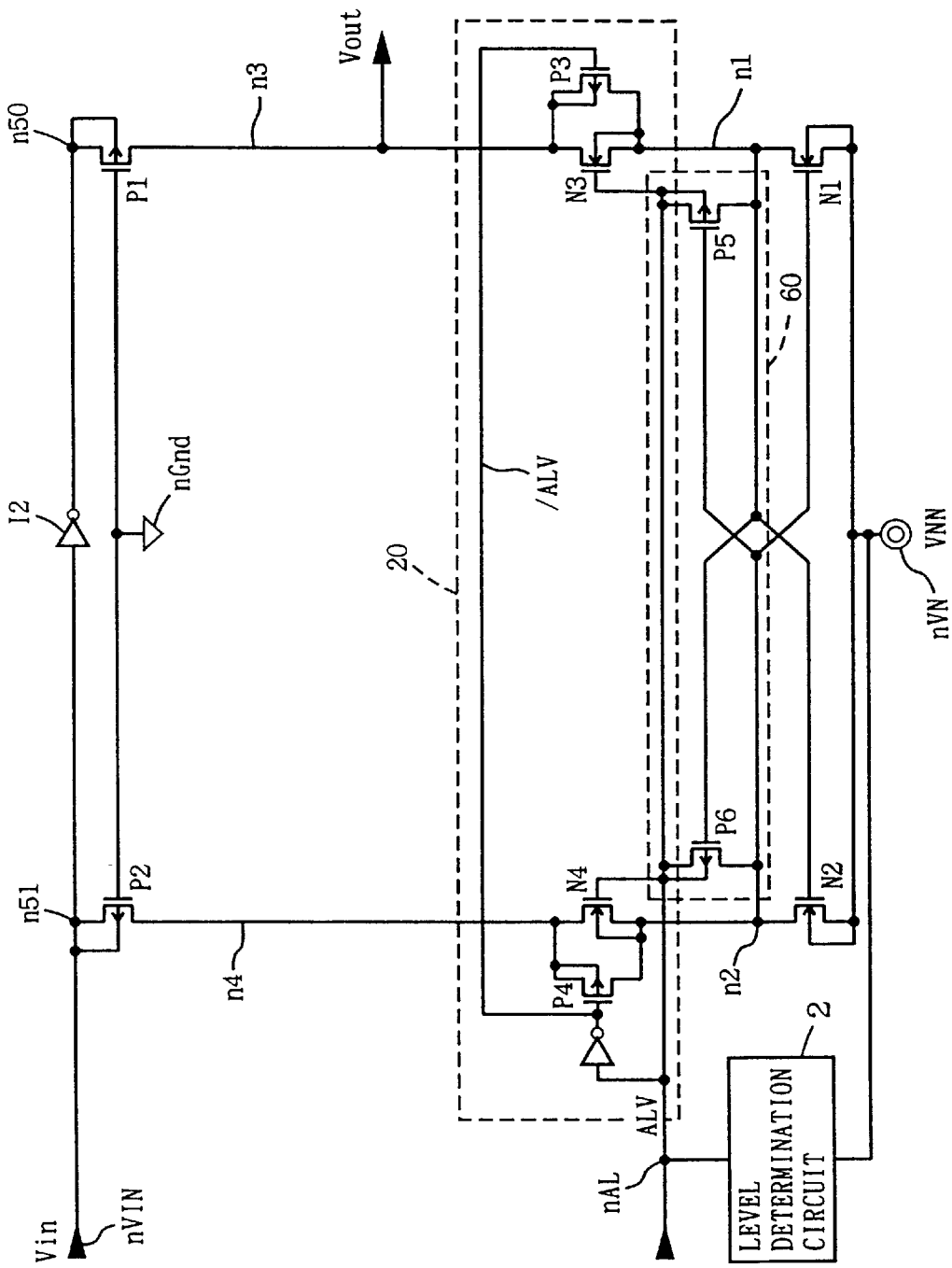

FIG. 14 is a circuit diagram showing a structure of a voltage level converter circuit according to a fourteenth embodiment of the present invention. The voltage level converter circuit of the fourteenth embodiment has a structure similar to that of the voltage level converter circuit of the thirteenth embodiment, provided that a voltage alleviate unit 20 is substituted for voltage alleviate unit 10.

The voltage level converter circuit of the fourteenth embodiment has an advantage similar to that of the voltage level converter circuit of the thirteenth embodiment, in addition to the advantage of improving the reliability of the operation of N channel MOS transistors N1 and N2.

Fifteenth Embodiment

Figure 15:
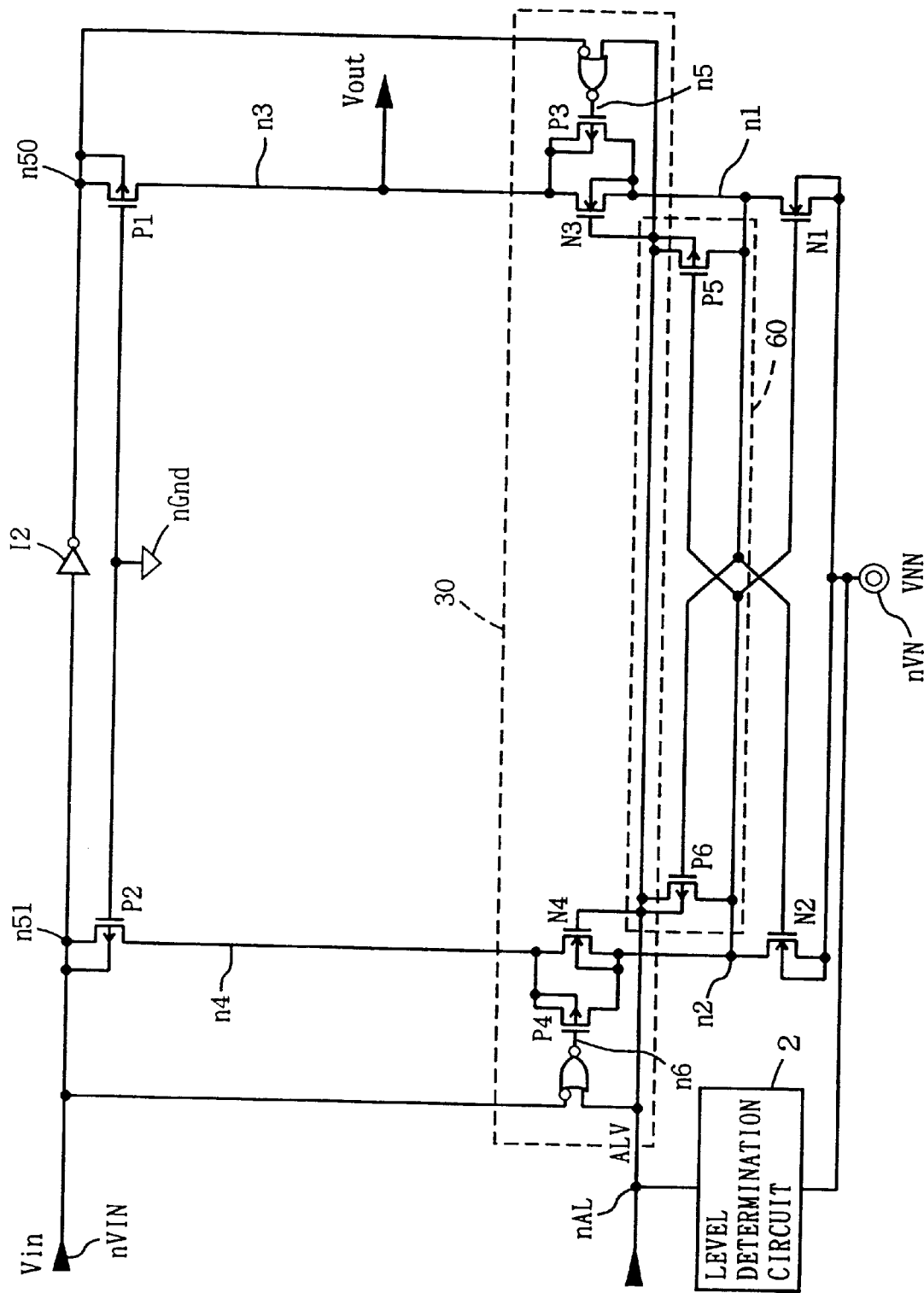

FIG. 15 is a circuit diagram showing a structure of a voltage level converter circuit according to a fifteenth embodiment of the present invention. The voltage level converter circuit of the fifteenth embodiment has a structure similar to that of the voltage level converter circuit of the fourteenth embodiment, provided that a voltage alleviate unit 30 is substituted for voltage alleviate unit 20.

The voltage level converter circuit of the fifteenth embodiment has an advantage similar to that of the voltage level converter circuit of the fourteenth embodiment, in addition to the advantage of improving the reliability of the switching operation of P channel MOS transistors P3 and P4.

Sixteenth Embodiment

Figure 16:
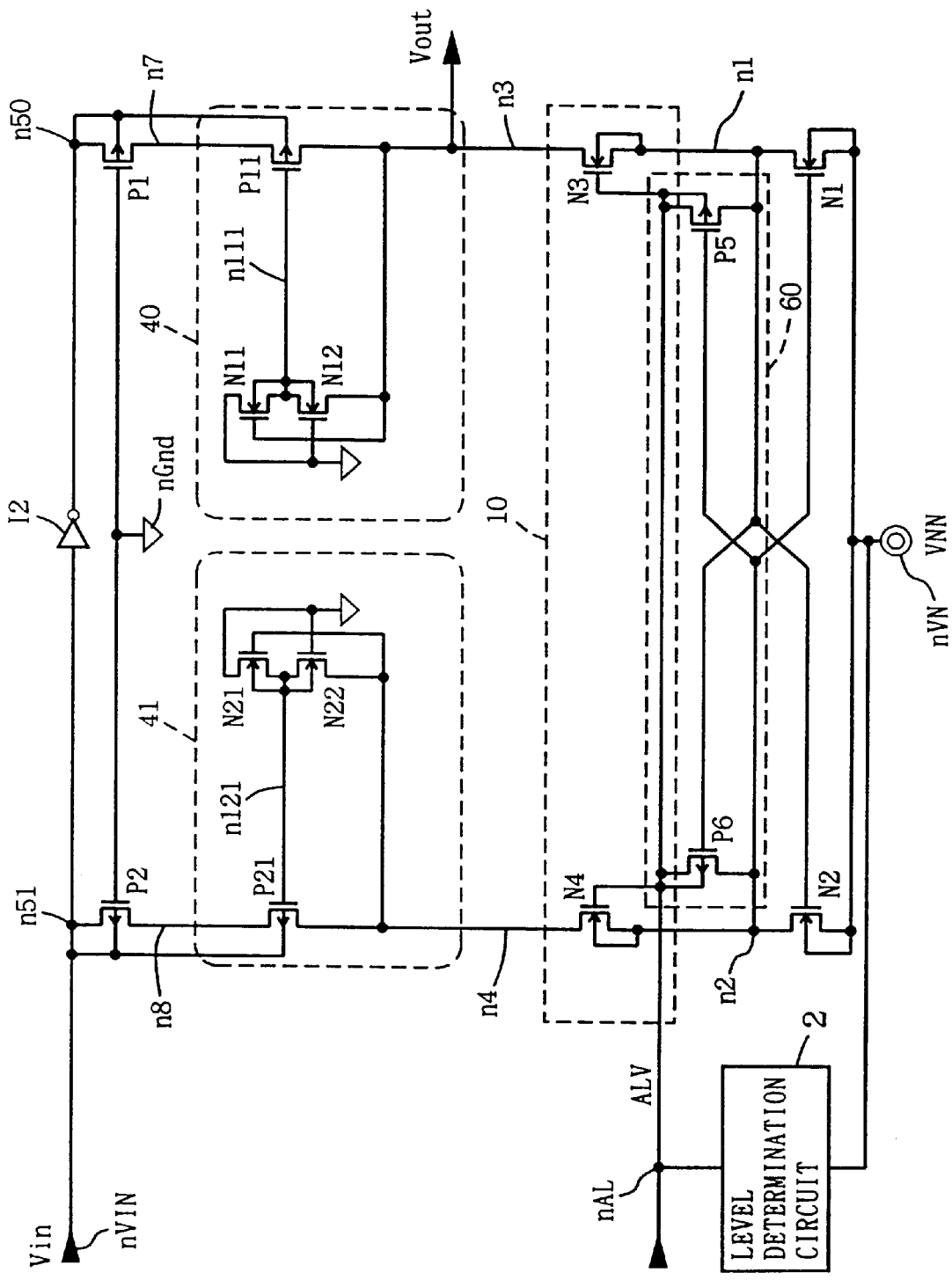

FIG. 16 is a circuit diagram showing the structure of a voltage level converter circuit according to a sixteenth embodiment of the present invention. The voltage level converter circuit of the sixteenth embodiment has a structure similar to that of the voltage level converter circuit of the thirteenth embodiment, provided that alleviate circuits 40 and 41 are further included.

The voltage level converter circuit of the sixteenth embodiment has an advantage similar to that of the voltage level converter circuit of the thirteenth embodiment, in addition to the advantage of alleviating the voltage across the source and drain of P channel MOS transistors P1 and P2 to improve the reliability thereof.

Seventeenth Embodiment

Figure 17:
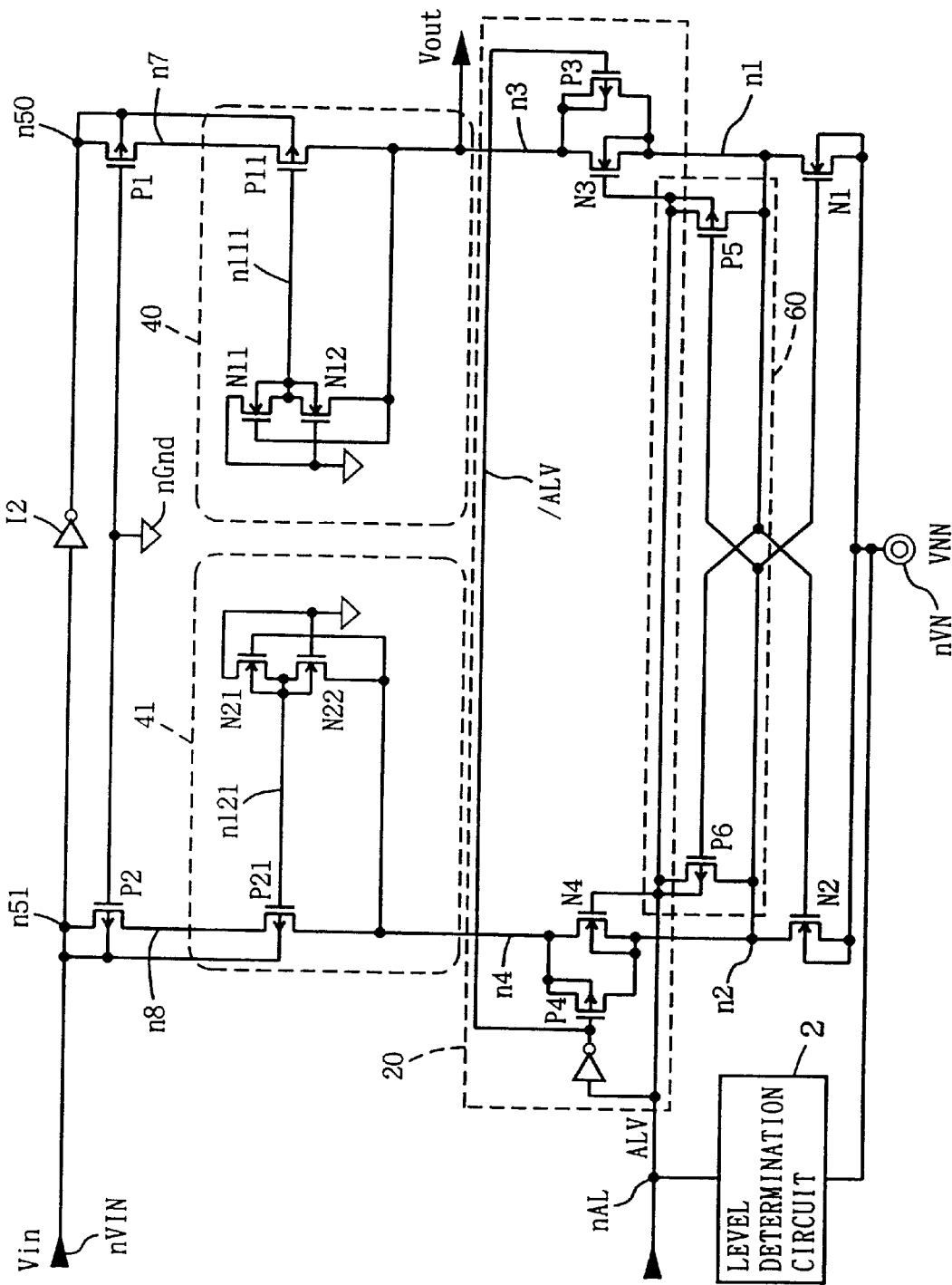

FIG. 17 is a circuit diagram showing the structure of a voltage level converter circuit according to a seventeenth embodiment of the present invention. The voltage level converter circuit of the present embodiment has a structure similar to that of the voltage level converter circuit of the fourteenth embodiment, provided that alleviate circuits 40 and 41 are further included.

The voltage level converter circuit of the present seventeenth embodiment has an advantage similar to that of the voltage level converter circuit of FIG. 14, in addition to the advantage of improving the reliability of P channel MOS transistors P1 and P2.

Eighteenth Embodiment

Figure 18:
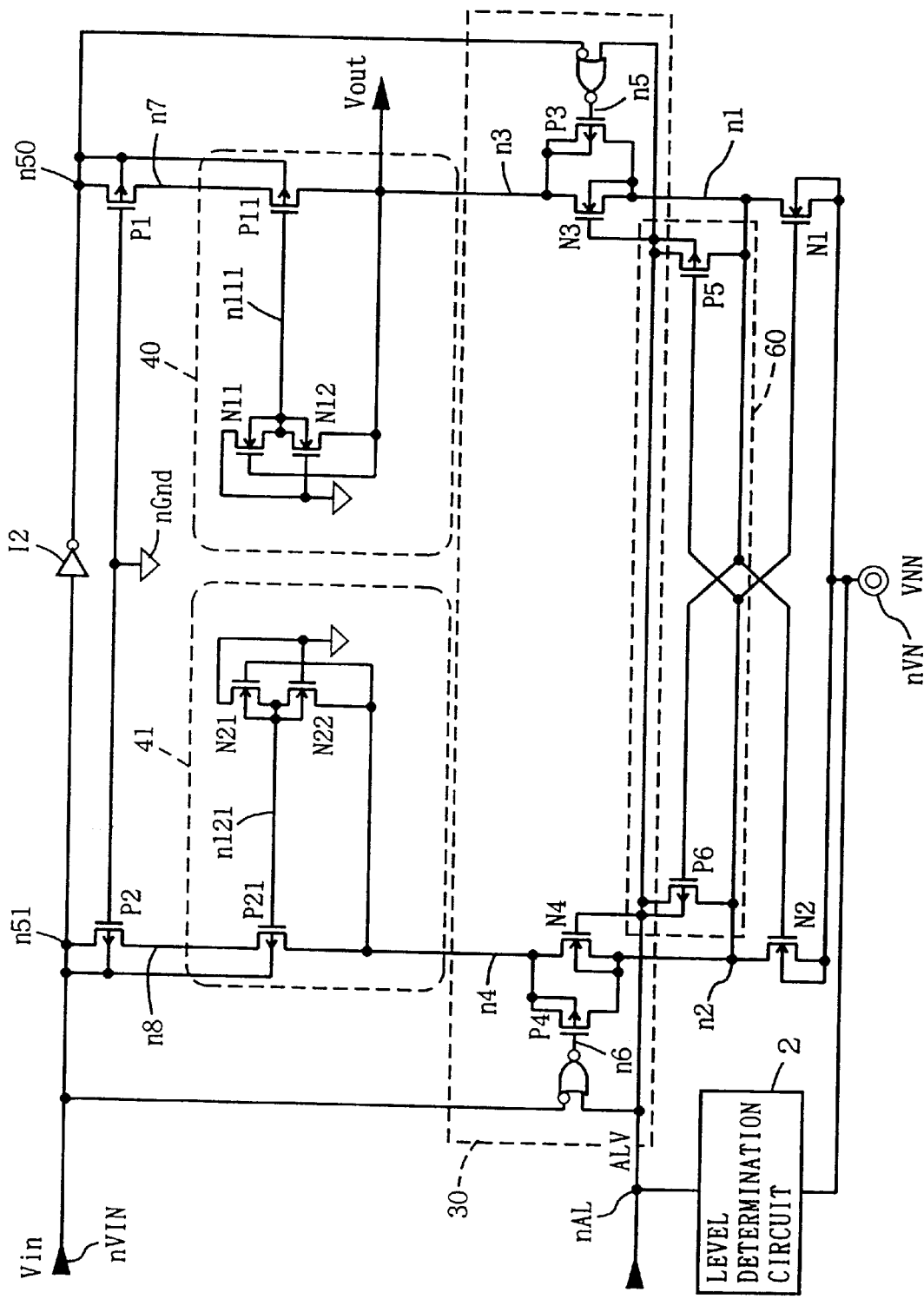

FIG. 18 is a circuit diagram showing a structure of a voltage level converter circuit according to an eighteenth embodiment of the present invention. The voltage level converter circuit of the present embodiment has a structure similar to that of the voltage level converter circuit of the fifteenth embodiment, provided that alleviate circuits 40 and 41 are further included.

The voltage level converter circuit according to an eighteenth embodiment of the present invention has an advantage similar to that of the voltage level converter circuit of the fifteenth embodiment, in addition to the advantage of improving the reliability of P channel MOS transistors P1 and P2.

Nineteenth Embodiment

Figure 19:
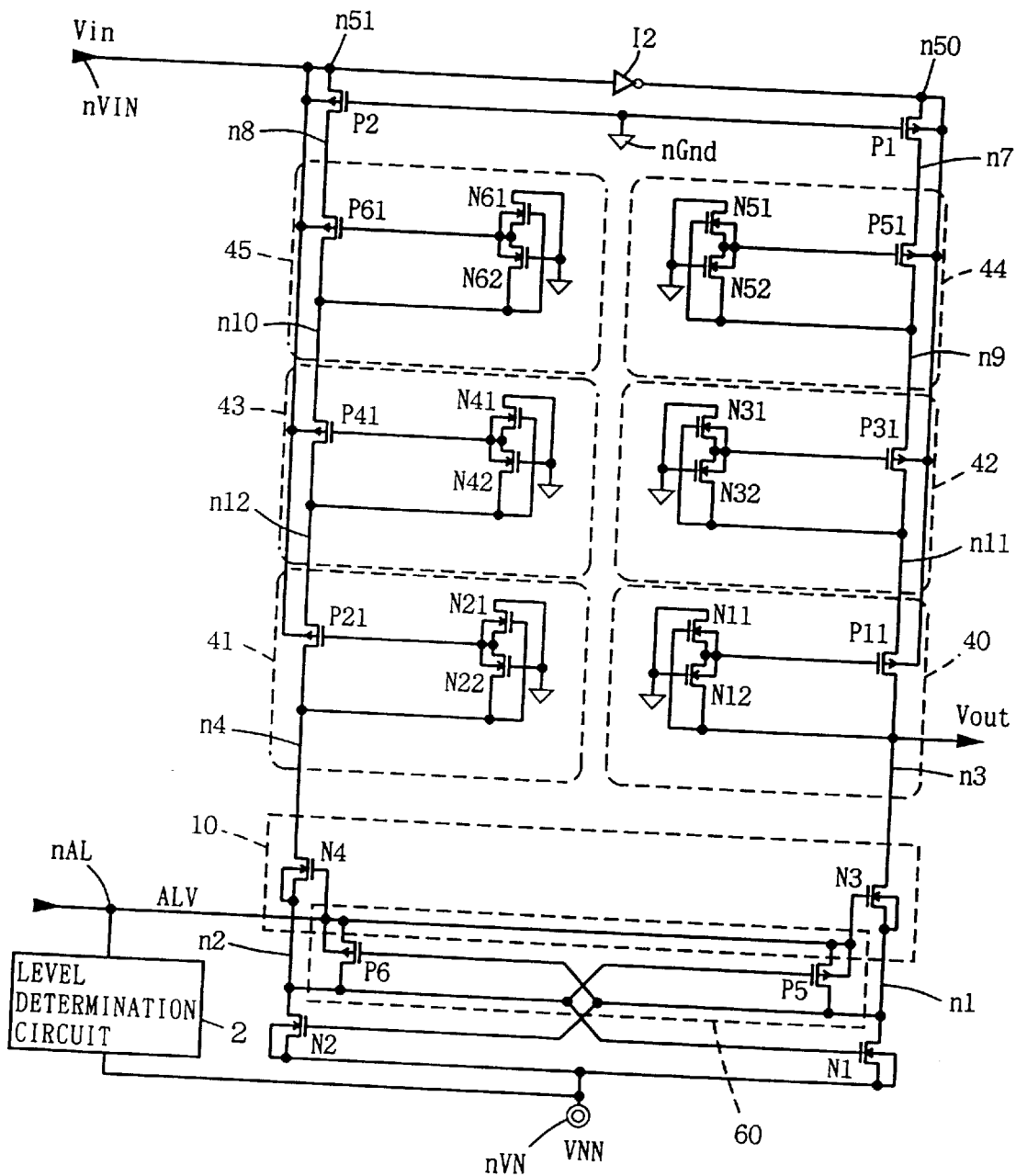

FIG. 19 is a circuit diagram showing a structure of a voltage level converter circuit according to an nineteenth embodiment of the present invention. The voltage level converter circuit of the present embodiment has a structure similar to that of the voltage level converter circuit of the sixteenth embodiment, provided that alleviate circuits 42 and 44 connected in series with alleviate circuit 40, and alleviate circuits 43 and 45 connected in series with alleviate circuit 41 are further included.

The voltage level converter circuit according to the nineteenth embodiment of the present invention has an advantage similar to that of the voltage level converter circuit of the sixteenth embodiment, in addition to the advantage of alleviating the voltage across the source and drain of P channel MOS transistors P1 and P2 to further improve the reliability of P channel MOS transistors P1 and P2.

Twentieth Embodiment

Figure 20:
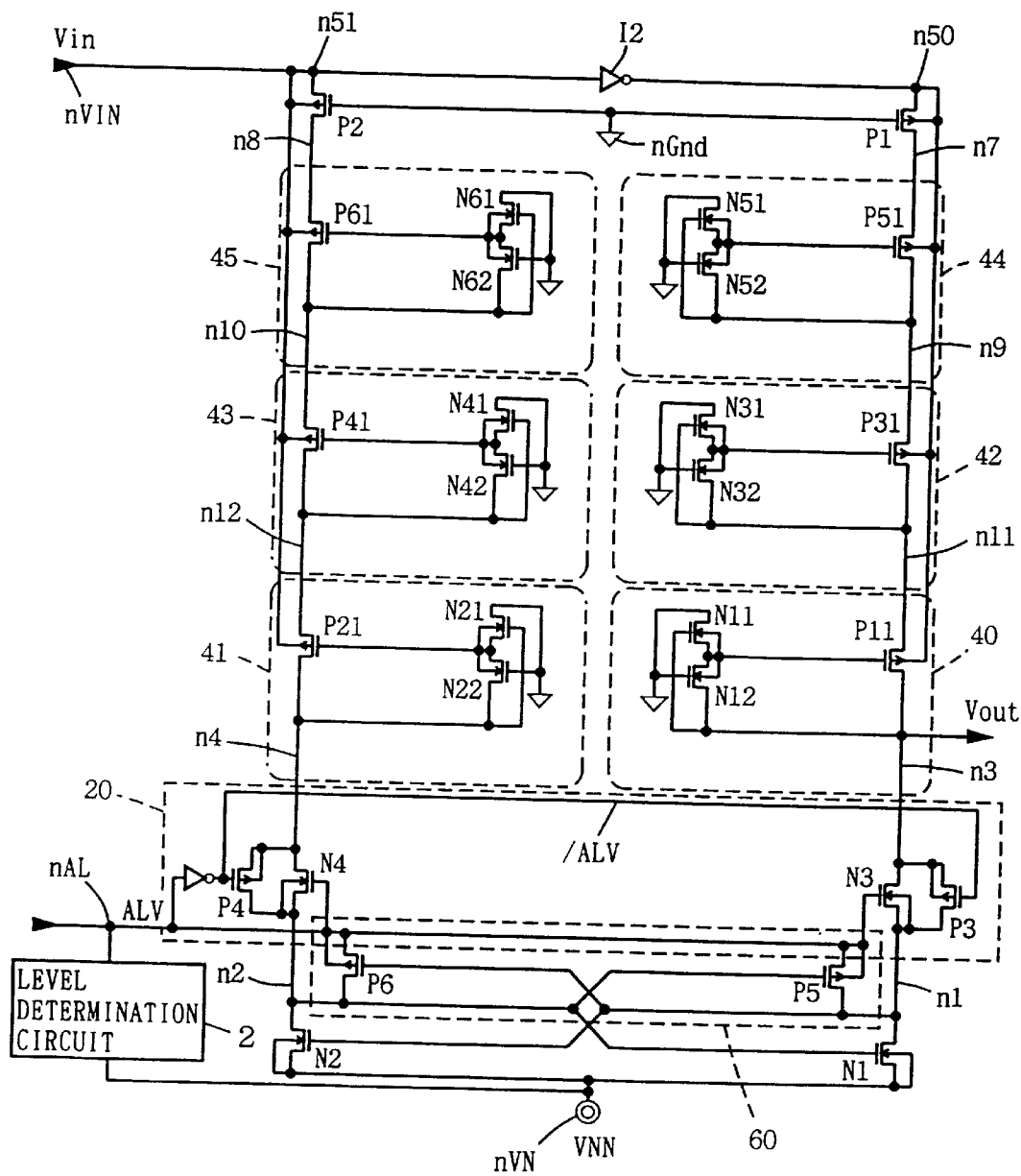

FIG. 20 is a circuit diagram showing a structure of a voltage level converter circuit according to a twentieth embodiment of the present invention. The voltage level converter circuit of the present embodiment has a structure similar to that of the voltage level converter circuit of the seventeenth embodiment, provided that alleviate circuits 42 and 44 connected in series with alleviate circuit 40, and alleviate circuits 43 and 45 connected in series with alleviate circuit 41 are further included.

The voltage level converter circuit of the present twentieth embodiment has an advantage similar to that of the voltage level converter circuit of the seventeenth embodiment, in addition to the advantage of further improve the reliability of P channel MOS transistors P1 and P2.

Twenty-first Embodiment

Figure 21:
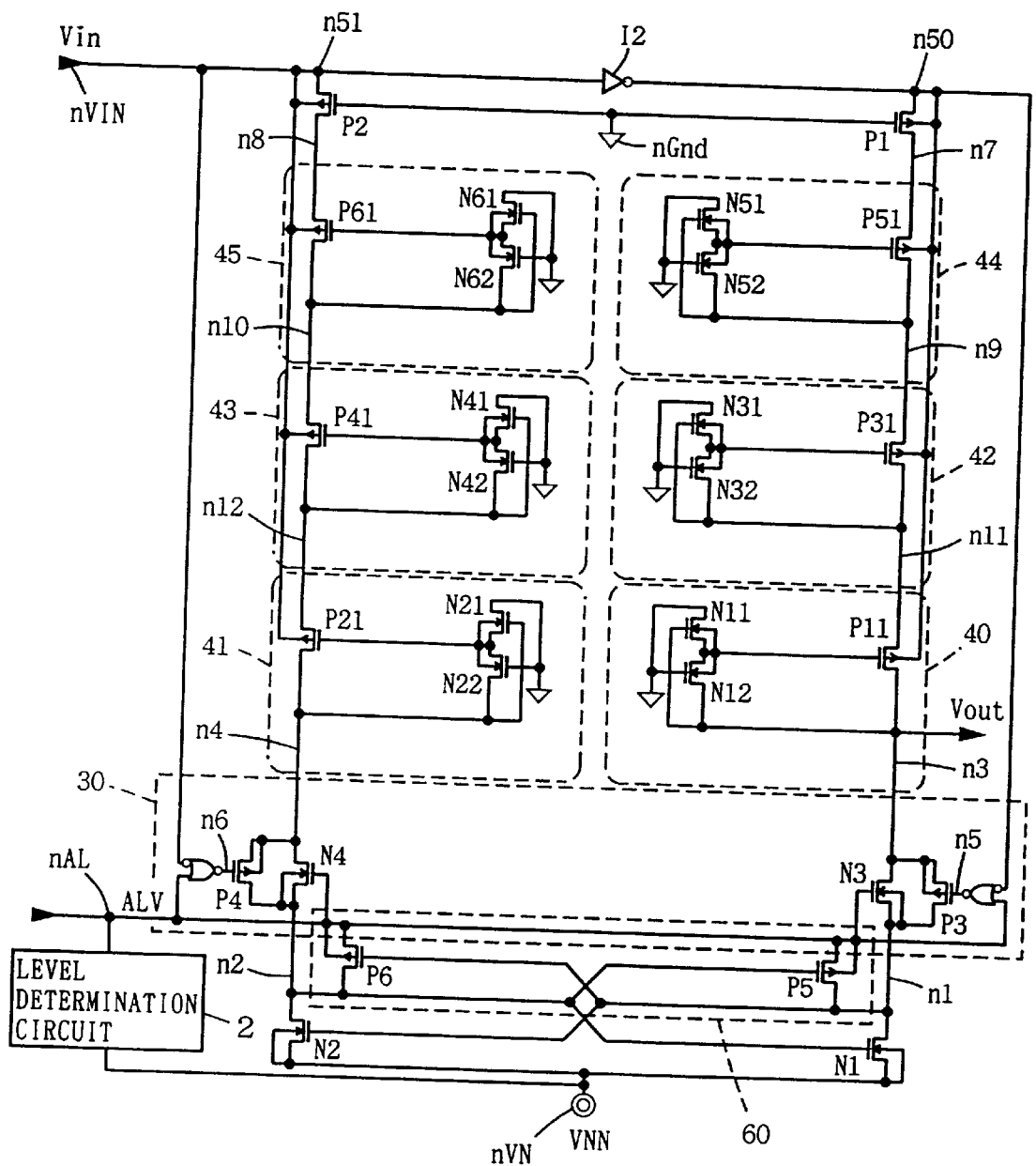

FIG. 21 is a circuit diagram showing a structure of a voltage level converter circuit according to a twenty-first embodiment of the present invention. The voltage level converter circuit of the present embodiment has a structure similar to that of the voltage level converter circuit of the eighteenth embodiment, provided that alleviate circuits 42 and 44 connected in series with alleviate circuit 40, and alleviate circuits 43 and 45 connected in series with alleviate circuit 41 are further included.

The voltage level converter circuit of the twenty-first embodiment of the present invention has an advantage similar to that of the voltage level converter circuit of the eighteenth embodiment, in addition to the advantage of further improve the reliability of P channel MOS transistors P1 and P2.

Twenty-second Embodiment

Figure 22:
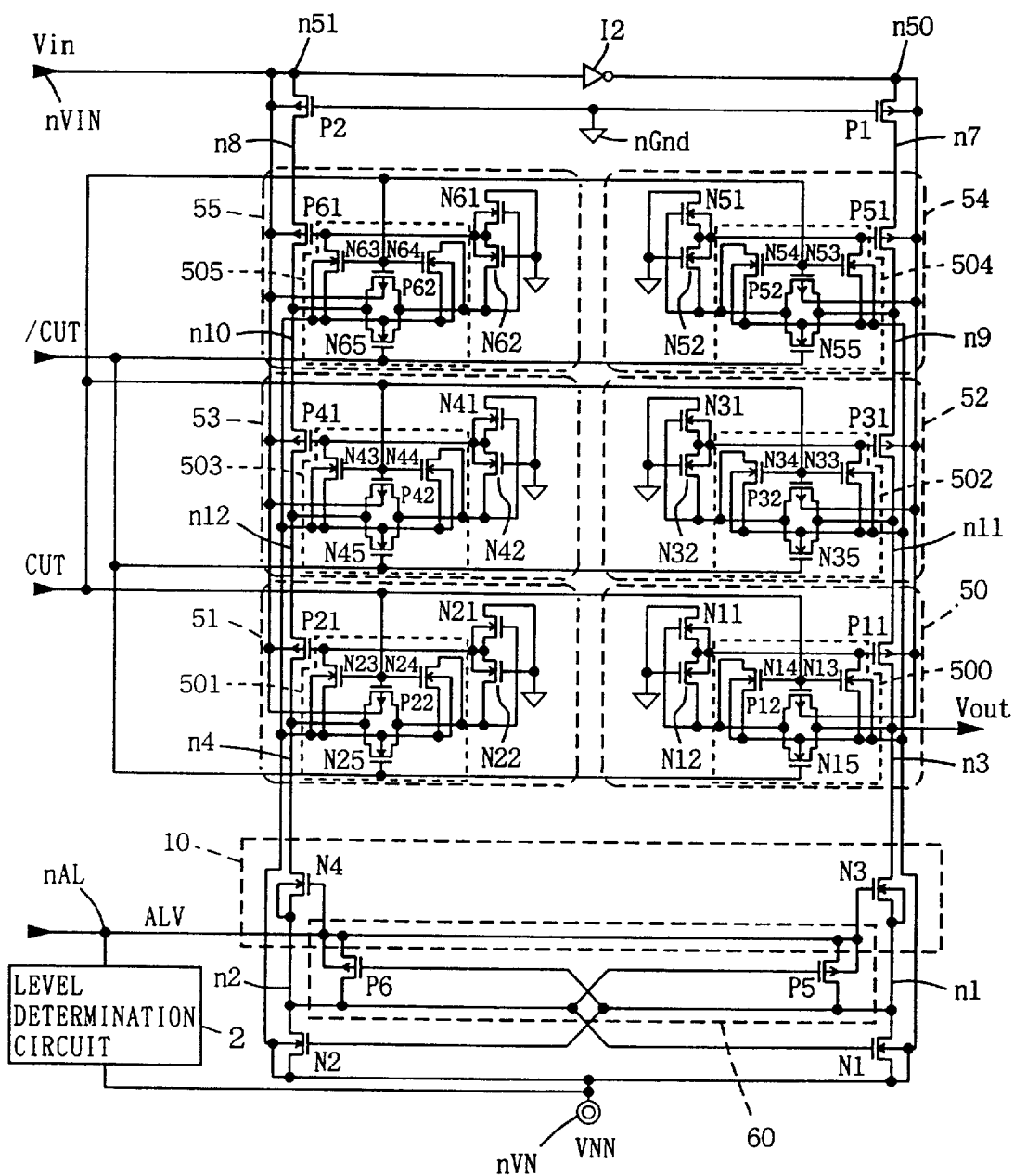

FIG. 22 is a circuit diagram showing a structure of a voltage level converter circuit according to a twenty-second embodiment of the present invention. The voltage level converter circuit of the present embodiment has a structure similar to that of the voltage level converter circuit according to the nineteenth embodiment of the present invention, provided that alleviate circuits 50–55 including control circuits 500–505, respectively, are substituted for alleviate circuits 40–45.

The voltage level converter circuit according to the twenty-second embodiment of the present invention has an advantage similar to that of the voltage level converter circuit of the nineteenth embodiment, in addition to the advantage of preventing erroneous operation by avoiding a high impedance state of nodes n7–n12 when voltage VNN applied to node nVN is 0V.

The relationship between the voltage of each node according to voltage VNN applied to node VN and voltage Vin applied to node nVIN, and the state of each transistor is set forth in the following.

TABLE 11

| VNN | Vin | ALV | P2 | n4 | N4 | n2 | N2 | N1 | n1 | N3 | n3 | P1 | N101 | N102 | Vout1 |
|---|---|---|---|---|---|---|---|---|---|---|---|---|---|---|---|
| −11 V | H(3.3 V) | L(0 V) | On | 3.3 V | Off | 0 V | Off | On | −11 V | On | −11 V | Off | On | Off | 0 V |
|  | L(0 V) | L(0 V) | Off | −11 V | On | −11 V | On | Off | 0 V | Off | 3.3 V | On | Off | On | −11 V |
| 0 V | H(3.3 V) | H(3.3 V) | On | 3.3 V | Off | 3.3 V | Off | On | 0 V | On | 0 V | Off | On | Off | 0 V |
|  | L(0 V) | H(3.3 V) | Off | 0 V | On | 0 V | On | Off | 3.3 V | Off | 3.3 V | On | Off | On | 0 V |

Twenty-third Embodiment

Figure 23:
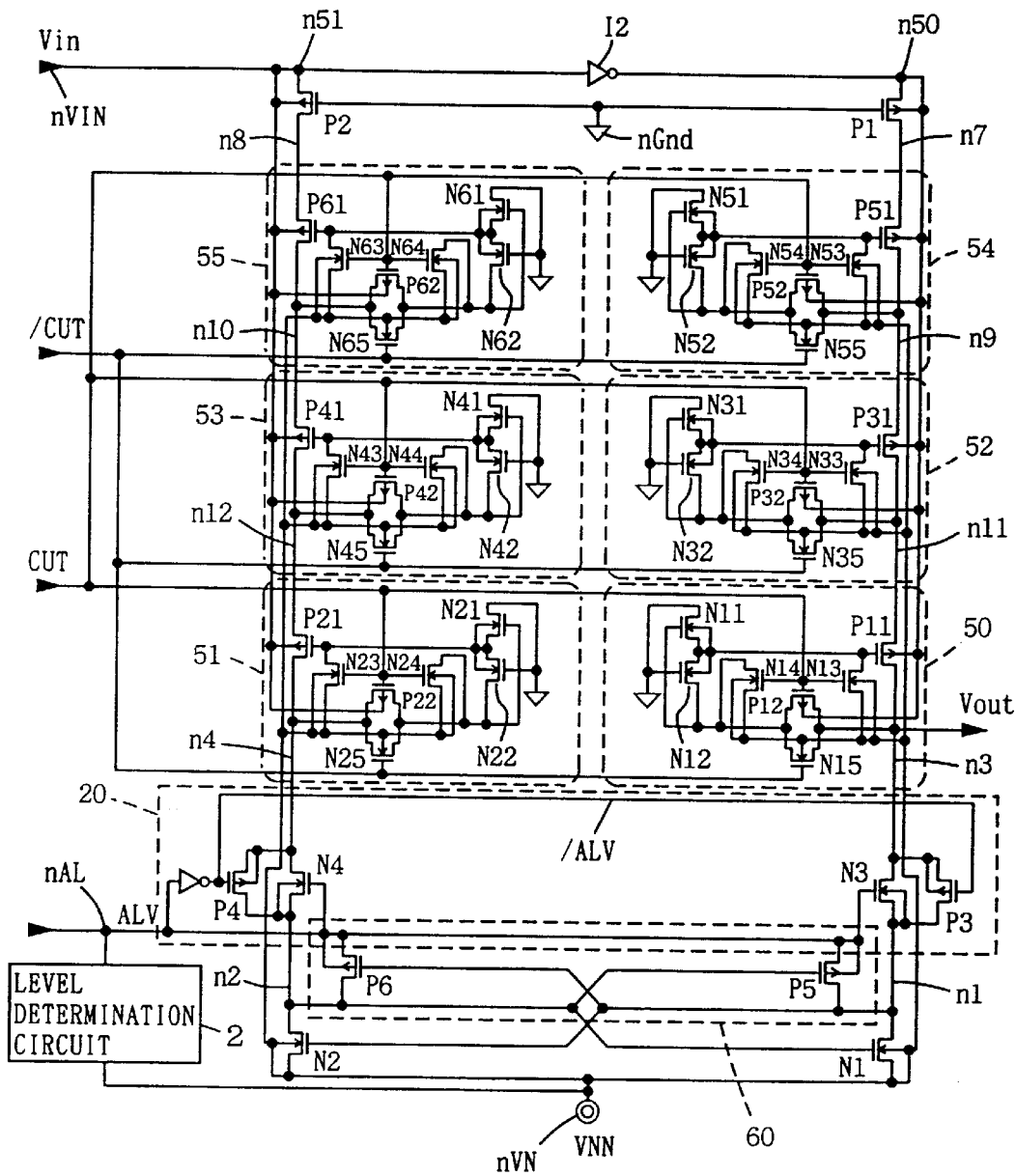

FIG. 23 is a circuit diagram showing a structure of a voltage level converter circuit according to a twenty-third embodiment of the present invention. The voltage level converter circuit of the present embodiment has a structure similar to that of the voltage level converter circuit of the twentieth embodiment, provided that alleviate circuits 50–55 are substituted for alleviate circuits 40–45.

The voltage level converter circuit according to the twenty-third second embodiment of the present invention has an advantage similar to that of the voltage level converter circuit of the twentieth embodiment, in addition to the advantage of preventing an erroneous operation by avoiding a high impedance state of nodes n7–n12.

Twenty-fourth Embodiment

Figure 24:
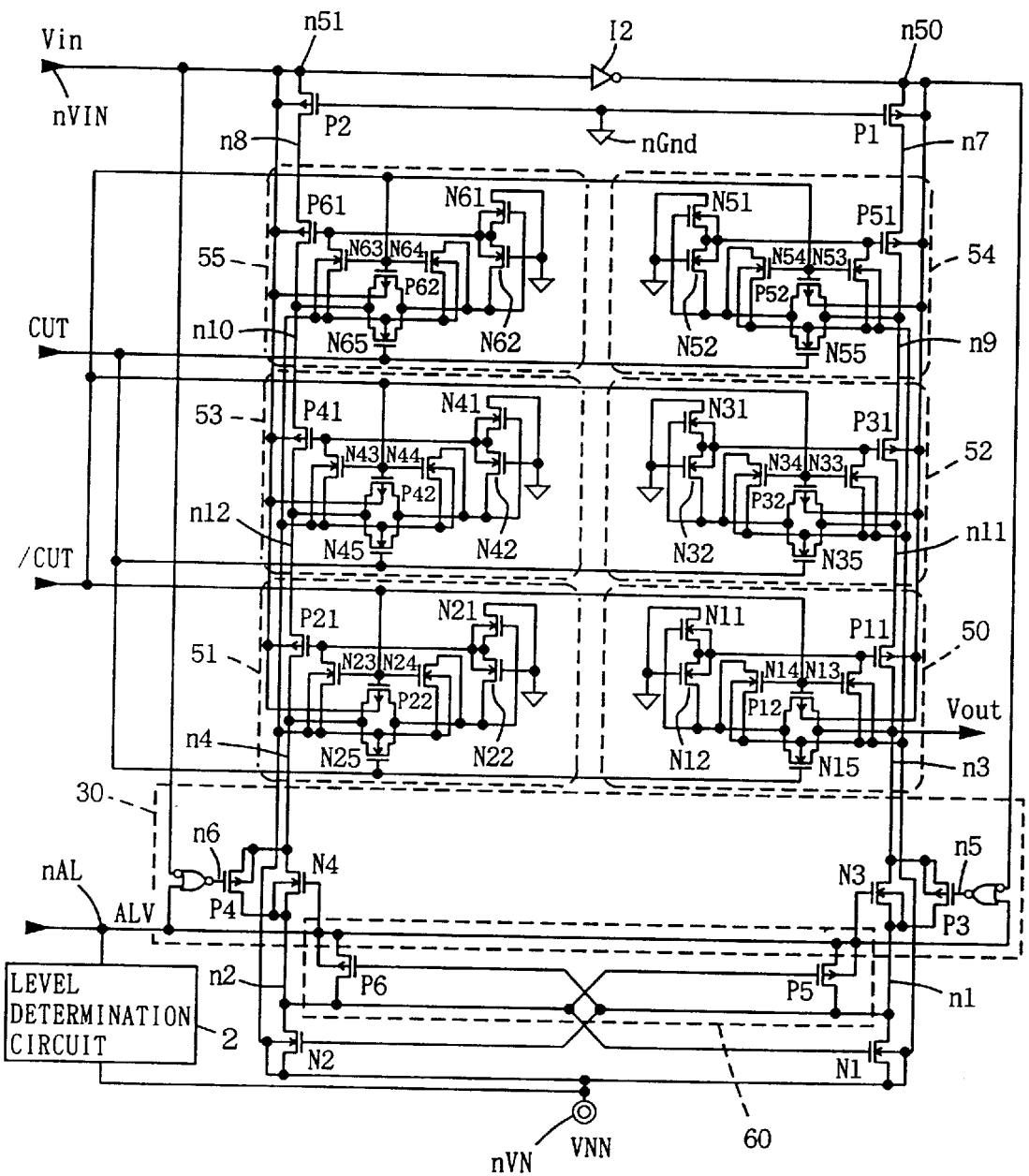

FIG. 24 is a circuit diagram showing a structure of a voltage level converter circuit according to a twenty-fourth embodiment of the present invention. The voltage level converter circuit of the present embodiment has a structure similar to that of the voltage level converter circuit of the twenty-first embodiment, provided that alleviate circuits 50–55 are substituted for alleviate circuits 40–45.

The voltage level converter circuit according to the twenty-fourth embodiment of the present invention has an advantage similar to that of the voltage level converter circuit of the twenty-first embodiment, in addition to the advantage of preventing erroneous operation by avoiding a high impedance state of nodes n7–n12.

Twenty-fifth Embodiment

FIG. 25 is a circuit diagram showing a structure of a voltage level converter circuit according to a twenty-fifth embodiment of the present invention. The voltage level converter circuit of the twenty-fifth embodiment has a structure similar to that of the voltage level converter circuit of the thirteenth embodiment, provided that a node nVout for providing a voltage nVout, a ground node nGnd, an N channel MOS transistor N101 connected between node nVout and ground node nGnd, and having a gate connected to node n4, and an N channel MOS transistor N102 connected between node nVout and node nVN, and having a gate connected to node n1 are further included.

In the voltage level converter circuit of the present twenty-fifth embodiment, voltage converter unit 200 provides voltage Vout1 according to voltage VNN supplied to voltage generator unit 200 and voltage Vin.

When a voltage VNN of −11V is supplied to node nVN and a voltage Vin of 3.3V is supplied to node nVIN, P channel MOS transistor P2 is turned on, and node n4 attains the voltage level of 3.3V. Here, N channel MOS transistor N101 is turned on since a voltage of 0V is supplied to the source thereof. Therefore, a voltage Vout1 of 0V is output therefrom.

When voltage VNN of −11V is supplied to node nVN and voltage Vin of 0V is supplied to node nVIN, voltage Vin of an L level is inverted by inverter I2. Therefore, P channel MOS transistor P1 is turned on, and node n3 attains the voltage level of 3.3V. Here, alleviate signal ALV attains the level of 0V, so that node n1 is at least 1V. As a result, N channel MOS transistor N2 is turned on, and the voltage of node n2 attains the level of −11V. Therefore, P channel MOS transistor P5 is turned on, and the voltage of node n1 attains the level of 0V. Here, N channel MOS transistor N102 has its source supplied with voltage VNN of −11V and its gate supplied with a voltage of 0V. Therefore, N channel MOS transistor N102 is turned on, so that voltage VNN of −11V is output as voltage Vout1.

According to the voltage level converter circuit of the present embodiment, 0V/voltage VNN can be output as voltage Vout1 according to the H/L level of voltage Vin.

When voltage VNN applied to node nVN is −11V, node n2 takes a voltage level between 0V and −11V. When this voltage is applied to the gate of N channel MOS transistor N101, transistor N101 will always be turned off with respect to a source voltage of 0V. Therefore, 0V cannot be properly output as voltage Vout1. Thus, N channel MOS transistor N101 has its gate connected to node n4 to ensure a desired switching operation of N channel MOS transistor N101.

The voltage level converter circuit of the present twenty-fifth embodiment has an advantage that a voltage VNN of 0V is output in contrast to the voltage level converter circuits of the first to twenty-fourth embodiments providing an voltage output from 3.3V to −11V. There is an advantage that 0V can be output accurately.

Voltage VNN is applied from an external charge pump to node nVN. Also, voltage Vin is used as an address signal and voltage Vout1 used as a predecode signal for selecting an external memory cell. The same applies to the above-described embodiments and also to the following embodiments.

Twenty-sixth Embodiment

Figure 26:
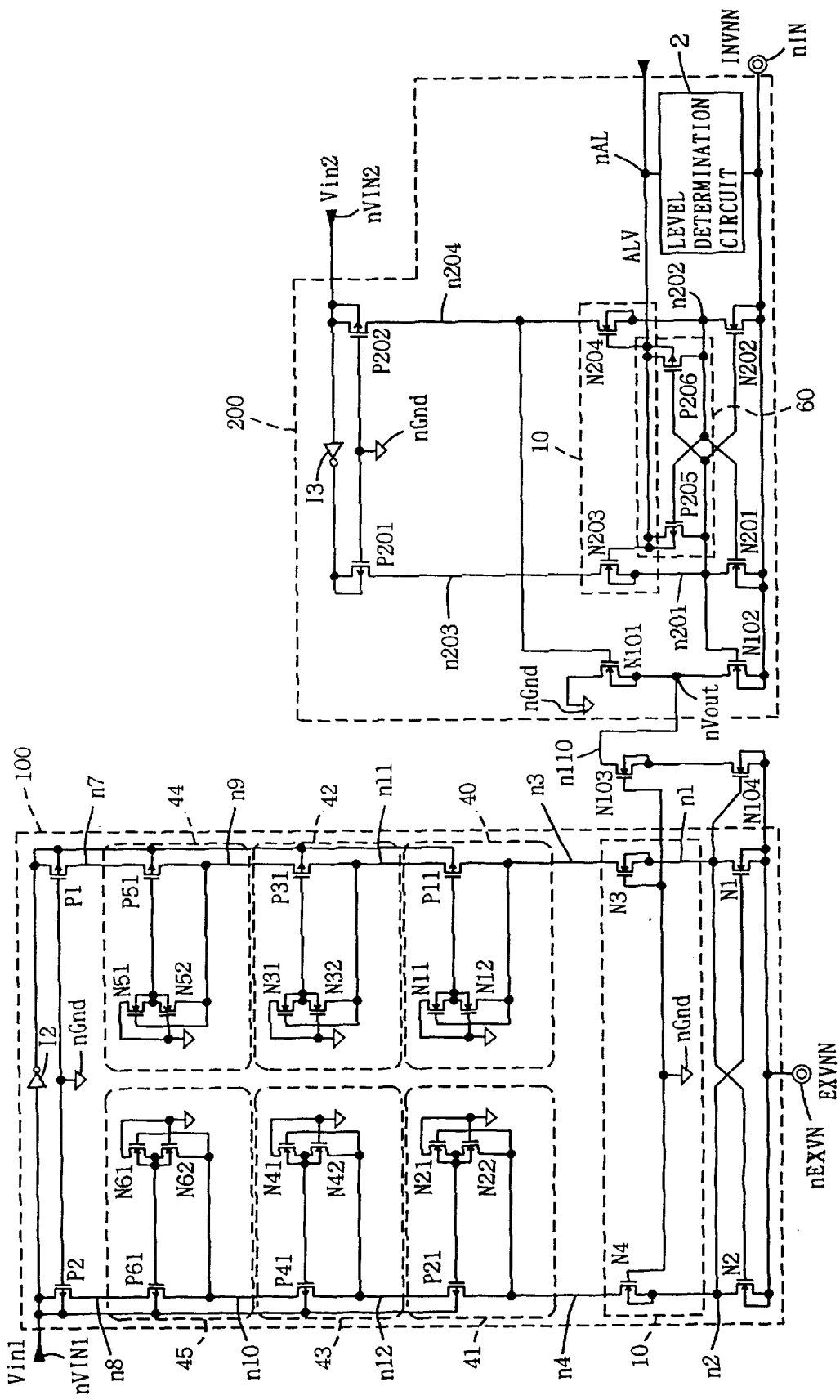

FIG. 26 is a circuit diagram showing a structure of a voltage level converter circuit according to a twenty-sixth embodiment of the present invention.

Referring to FIG. 26, the voltage level converter circuit of the twenty-sixth embodiment includes a voltage converter unit 100 having the gates of N channel MOS transistors N3 and N4 connected to ground node nGnd, for providing to node n1 a voltage according a voltage EXVNN applied to a node nEXVN and a voltage Vin1 applied to a node nVIN1, a voltage converter unit 200 for providing to node nVout a voltage according to a voltage INVNN of a node nIN and a voltage Vin2 supplied to a node nVIN2, a N channel MOS transistor N104 connected between node nVout and node nEXVN, and having a gate connected to node n1, and an N channel MOS transistor N103 connected between N channel MOS transistor N104 and node nVout, and having a gate connected to ground node nGnd. It is to be noted that there is a node n110 between N channel MOS transistor N103 and node nVout.

In the voltage level converter circuit of the present embodiment, an externally applied voltage VNN at node nEXVN is supplied to a memory cell (not shown) connected to node nIN when in a test mode (when voltages Vin1 and Vin2 both attain an L level (0V)). Voltage converter unit 100 and voltage converter unit 200 are disconnected when in a mode other than the test mode.

The voltage of main nodes according to voltage EXVNN and voltages Vin1 and Vin2 and the state of respective transistors is set forth in the following.

Thus, voltages Vin1 and Vin2 are both set to the voltage level of 3.3V in order to electrically cut off node nEXV from node nIN. Voltages Vin1 and Vin2 are both set to 0V in order to provide electrical connection between nodes nEXVN and nIN.

N channel MOS transistor N103 serves to alleviate the source-drain voltage of N channel MOS transistor N104. N channel MOS transistor N101 is provided for the purpose of preventing node n110 from attaining a high impedance state.

The voltage level converter circuit according to the twenty-sixth embodiment of the present invention can easily implement complete cutoff of two nodes nEXVN and nIN having different negative voltages EXVNN and INVNN by virtue of provision of N channel MOS transistors N102 and N104 turned off in response to the voltage levels of the supplied voltages Vin1 and Vin2.

Twenty-seventh Embodiment

Figure 27:
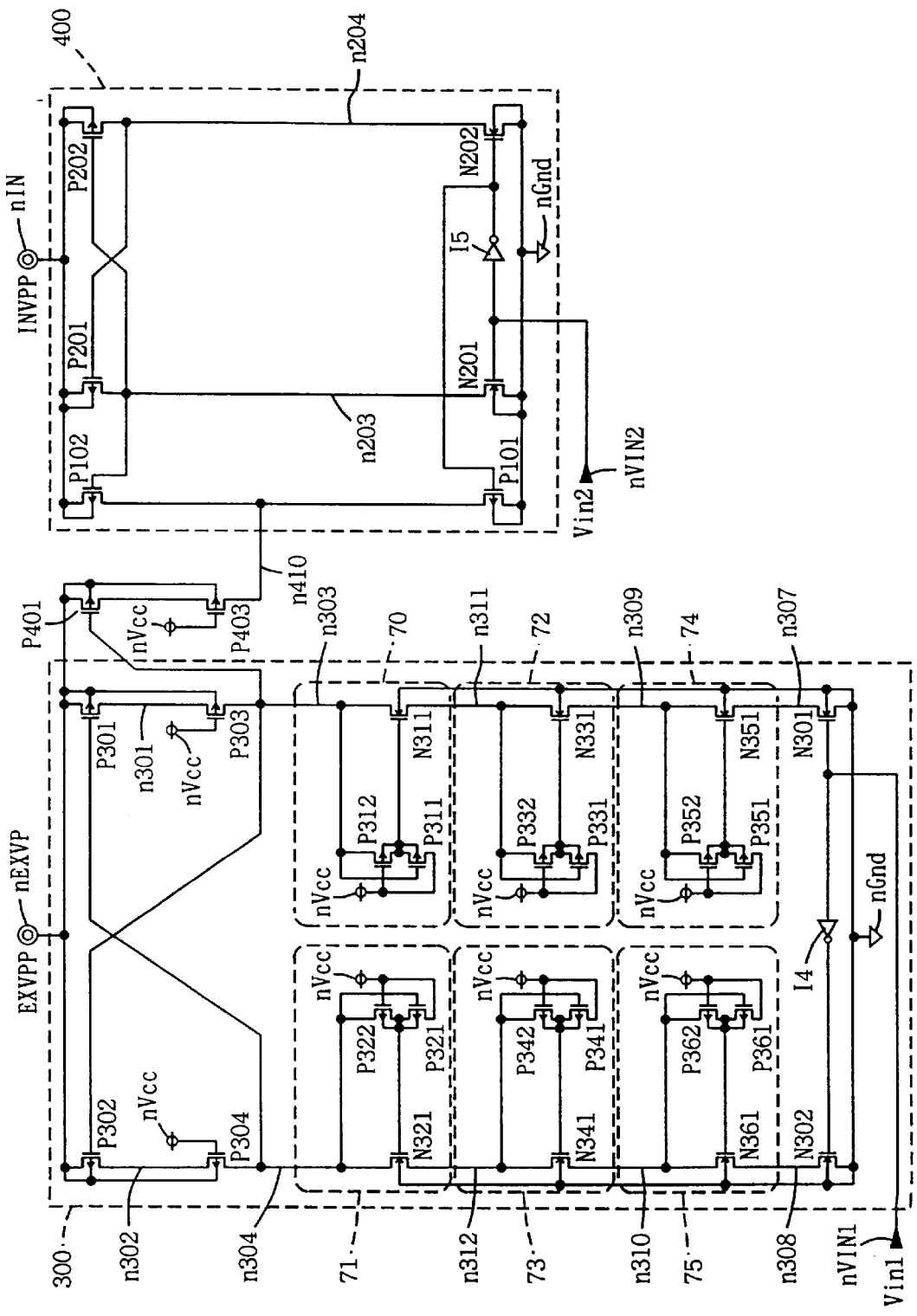

FIG. 27 is a circuit diagram showing a structure of a voltage level converter circuit according to a twenty-seventh embodiment of the present invention. The voltage level converter circuit of the twenty-seventh embodiment has a function similar to that of the voltage level converter circuit of the twenty-sixth embodiment. However, the positive and

TABLE 12

| Vin2 | Vin1 | EXVNN | N104 | N103 | n110 | N102 | N101 | n1 |
|---|---|---|---|---|---|---|---|---|
| H(3.3 V) | H(3.3 V) | −11 V | Off | Off | 0 V | Off | On | −11 V |
| H(3.3 V) | H(3.3 V) | 0 V | Off | Off | 0 V | Off | On | 0 V |
| H(3.3 V) | L(0 V) | −11 V | On | On | Inhibited | Off | On | −1 V |
| H(3.3 V) | L(0 V) | 0 V | On | Off | 0 V | Off | On | At least 2.3 V |
| L(0 V) | H(3.3 V) | EXVNN < INVNN | Off | Off | INVNN | On | Off | EXVNN |
| L(0 V) | H(3.3 V) | EXVNN > INVNN | Off | Off | Inhibited | On | Off | EXVNN |
| L(0 V) | L(0 V) | −11 V | On | On | −11 V | On | Off | −1 V |
| L(0 V) | L(0 V) | 0 V | On | Off | INVNN | On | Off | At least 2.3 V |

It is appreciated from Table 12 that N channel MOS transistors N102, N103 and N104 are turned off, so that node nEXVN is electrically cut off from node nIN when voltages Vin1 and Vin2 both attain the level of 3.3V. Here, N channel MOS transistor N101 is ON, and node nVout (node n110) attains the level of 0V. Therefore, node nEXVN and node nIN take arbitrary negative values independently.

When voltage Vin2 is 3.3V and voltage Vin1 is 0V, the gate of N channel MOS transistor N104 is supplied with a voltage of 1−V and at least 2.3V when voltage EXVNN applied to node nEXVN is −11V and 0V, respectively. Therefore, N channel MOS transistor N104 is turned on.

Here, N channel MOS transistor N103 is turned on only when voltage EXVNN is −11V. However, since N channel MOS transistor N101 is on and node n110 is set to the voltage level of 0V, voltage EXVNN is inhibited of taking a value other than 0V.

When voltage Vin2 is 0V and voltage Vin1 is 3.3V , N channel MOS transistors N103 and N104 are turned off and N channel MOS transistor N102 is turned on. Therefore, nodes n110 and nIN are electrically connected. Voltage EXVNN is inhibited of taking a value greater than voltage INVNN since there is a possibility of N channel MOS transistors N103 and N104 being turned on in such a case.

When voltages Vin2 and Vin1 both attain the level of 0V, N channel MOS transistor N102 is turned on, and nodes n110 and nIN are electrically connected. Also, N channel MOS transistor N104 is turned on. Therefore, node nEXVN is electrically connected to node nIN. However, when voltage EXVNN becomes greater than −11V, N channel MOS transistor N103 will be turned off, so that node nEXVN is electrically cut off from node nIN.

negative voltage relationships are inverted, and an external positive high voltage EXVPP is applied instead of a negative high voltage EXVNN.

Voltage converter unit 300 corresponds to voltage converter unit 100 of FIG. 26, and voltage converter unit 400 corresponds to voltage converter unit 200. Also, P channel MOS transistor P401 corresponds to N channel MOS transistor N104, and P channel MOS transistor P403 corresponds to N channel MOS transistor N103. Furthermore, alleviate circuits 70–75 correspond to alleviate circuits 40–45.

Each of alleviate circuits 70–75 has the same structure. For example, alleviate circuit 70 includes a power supply voltage node nVcc, P channel MOS transistors P311 and P312, and an N channel MOS transistor N311.

Voltage converter unit 300 includes a power supply voltage node nVcc, a ground node nGnd, alleviate circuits 70–75, an inverter I4, N channel MOS transistors N301, N302, and P channel MOS transistors P301–P304.

Voltage converter unit 400 includes a ground node nGnd, an inverter I5, N channel MOS transistors N201 and N202, and P channel MOS transistors P101, P102, P201, and P202.

The operation of the voltage level converter circuit of the twenty-seventh embodiment of the present invention will be described hereinafter.

When voltages Vin1 and Vin2 supplied to nodes nVIN1 and nVIN2, respectively, both attain the voltage level of 3.3V , nodes nEXVP and nIN are electrically connected. However, when respective voltages become lower than the sum of power supply voltage Vcc and the threshold voltage Vthp of P channel MOS transistor P403, node nEXVP and node nIN are electrically cut off since P channel MOS transistor P403 is turned off.

When voltages Vin1 and Vin2 both attain the level of 0V, P channel MOS transistors P401 and P102 are both turned off. Therefore, node nEXVP and node nIN can independently take arbitrary positive voltages. Here, P channel MOS transistor P101 is on and node n410 attains the voltage level of 0V.

According to the voltage level converter circuit of the twenty-seventh embodiment, complete cutoff can easily be implemented of two nodes nEXVP and nIN having different positive voltages EXVPP and INVPP.

Twenty-eighth Embodiment

Figure 28:
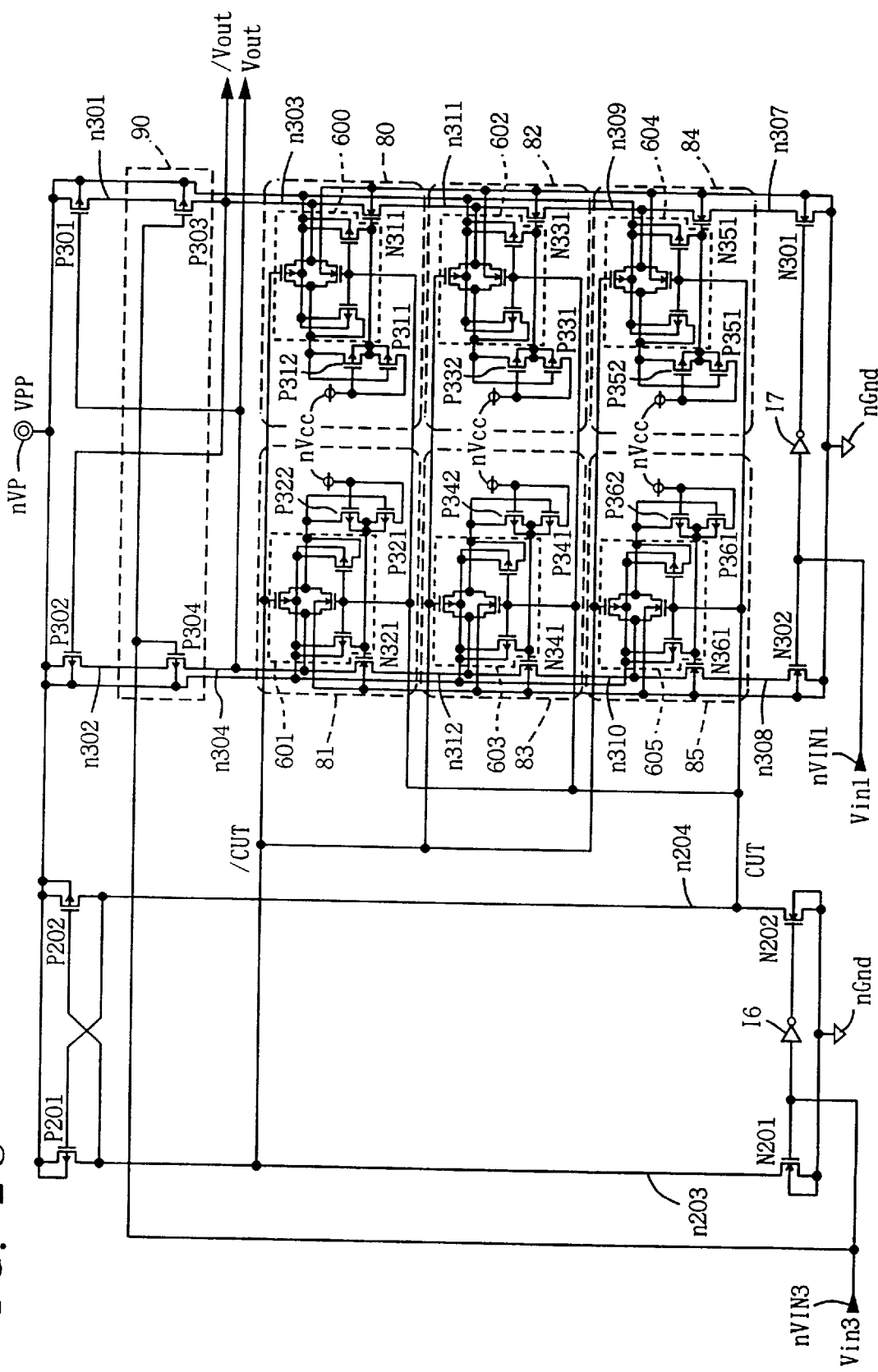

FIG. 28 is a circuit diagram showing a structure of a voltage level converter circuit according to a twenty-eighth embodiment of the present invention. The voltage level converter circuit of the present embodiment has a function similar to that of the voltage level converter circuit of the tenth embodiment. However, the positive and negative voltage relationship is inverted, and an external positive high voltage Vpp is supplied to node nVP instead of a negative high voltage VNN.

P channel MOS transistors P301 and P302 correspond to N channel MOS transistors N1 and N2 shown in FIG. 10. Voltage alleviate unit 90 corresponds to voltage alleviate unit 10. Also, alleviate circuits 80–85 correspond to alleviate circuits 50–55, respectively.

Each of alleviate circuits 80–85 has a similar structure. For example, alleviate circuit 80 includes a control circuit 600, P channel MOS transistors P311, P312, an N channel MOS transistor N311, and a power supply voltage node nvcc.

The voltage level converter circuit of the twenty-eighth embodiment further includes ground node nGnd, a node nVIN1 to which a voltage Vin1 is supplied, a node nVIN3 to which a voltage Vin3 is supplied, inverters I6, I7, N channel MOS transistors N201, N202, N301, N302, and P channel MOS transistors P201, P202.

A relationship between the voltage of main nodes according to voltages VPP and Vin1 and the state of respective transistors is set forth in the following.

P channel MOS transistors P301 and P303 are turned on, and nodes n301 and n303 attain the voltage level of 3.3V.

Since a voltage of 3.3V is supplied to the gate of N channel MOS transistor N311 by control circuit 600, node n311 attains a high impedance state of at least 2.3V that is lower than 3.3V by the threshold voltage Vth (1V) of N channel MOS transistor N311.

Similarly, nodes n309 and n307 attain a high impedance state of at least 2.3V.

N channel MOS transistor N301 is turned off since a voltage of 0V is supplied to the gate thereof by inverter I7.

When voltage VPP supplied to node nVP is 12V, voltage Vin3 is 3.3V. In response, N channel MOS transistor N201 is turned on, and node n203 attains the voltage level of 0V. Also, P channel MOS transistor P202 is turned on since the gate thereof is connected to node n203. Therefore, node n204 attains the voltage level of 12V. When, voltage Vin1 is 3.3V, N channel MOS transistor N302 is turned on, and node n308 attains the voltage level of 0V. Here, N channel MOS transistors N361, N341 and N321 are sequentially turned on since power supply voltage Vcc is supplied to respective gates thereof. Voltage Vout of 0V is output. Here, P channel MOS transistor P304 is turned off since voltage Vin3 of 3.3V is supplied to the gate thereof. Therefore, node n302 attains a high impedance state of not more than 4.3V.

P channel MOS transistor P301 is turned on since the gate thereof is connected to node n304. Therefore, node n301 attains the voltage level of 12V. Also, P channel MOS transistor P303 is on since a voltage Vin3 of 3.3V is supplied to the gate thereof. Therefore, voltage /Vout attains the level of 12V. Here, alleviate circuit 80 compares the 12V with the power supply voltage Vcc (3.3V) to supply the higher voltage to the gate of N channel MOS-transistor N311.

Therefore, node n311 attains a voltage level of 11V that is lower than the gate voltage of N channel MOS transistor N311 by the threshold voltage thereof. Similarly, nodes n309 and n307 attain the voltage levels of 10V and 9V, respectively. Also, N channel MOS transistor N301 is turned off since a voltage of 0V is supplied to both the gate and source thereof.

TABLE 13

| Vpp | Vin3 | n204 | n203 | Vin1 | N302 | n308 | Vout | P304 | n302 | n301 | P303 | Nout | n307 | N301 |
|---|---|---|---|---|---|---|---|---|---|---|---|---|---|---|
| 3.3 V | 0 V | 0 V | 3.3 V | 3.3 V | On | 0 V | 0 V | Off | Not more than 1 V | 3.3 V | On | 3.3 V | At least 2.3 V | Off |
| 3.3 V | 0 V | 0 V | 3.3 V | 0 V | Off | At least 2.3 V | 3.3 V | On | 3.3 V | Not more than 1 V | Off | 0 V | 0 V | On |
| 12 V | 3.3 V | 12 V | 0 V | 3.3 V | On | 0 V | 0 V | Off | Not more than 4.3 V | 12 V | On | 12 V | 9 V | Off |
| 12 V | 3.3 V | 12 V | 0 V | 0 V | Off | 9 V | 12 V | On | 12 V | Not more than 4.3 V | Off | 0 V | 0 V | On |

It is appreciated from Table 13 that, when voltage VPP supplied to node nVP is 3.3V , voltage Vin3 is 0V. In response, N channel MOS transistor N102 is turned on, and node n204 attains the voltage level of 0V. Also, P channel MOS transistor P201 is turned on since its gate is connected to node n204. Therefore, node n203 attains the voltage level of 3.3V. Here, N channel MOS transistor N302 is turned on and node n308 attains the voltage level of 0V when voltage Vin1 is 3.3V. N channel MOS transistors N361, N341, and N321 are sequentially turned on, whereby voltage Vout attains the level of 0V. Also, node n302 attains a high impedance state of not more than 1V since voltage Vin3 of 0V is supplied to the gate of P channel MOS transistor P304.

The voltage level converter circuit of the twenty-eighth embodiment provides the advantage that, in the circuit of converting a high voltage VPP to a predetermined voltage, nodes n307-n312 are prevented from attaining a high impedance state while the voltage across the source and drain of P channel MOS transistors P301, P302 and N channel MOS transistors N301 and N302 are alleviated.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A voltage level converter circuit, comprising:

a first node having a first voltage;

a first output node;

first voltage conversion means connected between said first node and said first output node, responsive to an input first switching signal for supplying a first internal voltage according to said first voltage to said first output node;

a second node having a second voltage;

a second output node;

a first transistor of a first conductivity type provided between said first node and said second output node, and having a gate connected to said first output node; and second voltage conversion means connected between said second node and said second output node, for supplying a second internal voltage according to said second voltage to said second output node, said second voltage conversion means including an internal node, a voltage converter responsive to an input second switching signal for converting said second voltage to supply a converted voltage to said internal node, and a second transistor of the first conductivity type connected between said second node and said second output node, and having a gate connected to said internal node.

2. The voltage level converter circuit according to claim 1, further comprising:

an intermediate node located on a connection line between said first transistor and said second transistor; and constant voltage supply means responsive to said second switching signal for supplying a constant voltage to said intermediate node.

3. The voltage level converter circuit according to claim 2, further comprising a third transistor of the first conductivity type connected between said first transistor and said second transistor.

4. The voltage level converter circuit according to claim 1, further comprising a third transistor, of the first conductivity type connected between said first transistor and said second transistor.

5. A voltage level converter circuit, comprising:

a first node having a first voltage;

a first voltage converter having a first output node and connected between said first node and said first output node, responsive to an input first switching signal for supplying a first internal voltage according to first voltage to said first output node;

a second node having a second voltage;

a second voltage converter having a second output node and connected between said second node and said second output node, responsive to an input second switching signal for supplying a second internal voltage according to said second voltage to said second output node;

a first transistor of a first conductivity type provided between said first node and said second node, and having a gate connected to said first output node; and a second transistor of the first conductivity type provided between said second node and said first transistor, and having a gate connected to said second output node.

6. The voltage level converter circuit according to claim 5, further comprising:

an intermediate node located on a connection line between said first transistor and said second transistor; and constant voltage supply means responsive to said second switching signal for supplying a constant voltage to said intermediate node.

7. The voltage level converter circuit according to claim 6, further comprising a third transistor of the first conductivity type connected between said first transistor and said second transistor.

8. The voltage level converter circuit according to claim 5, further comprising a third transistor of the first conductivity type connected between said first transistor and said second transistor.

* * * * *